US 12,132,065 B2

(12) United States Patent
Park et al.

(10) Patent No.: US 12,132,065 B2
(45) Date of Patent: Oct. 29, 2024

(54) SUBSTRATE FOR IMAGE SENSOR INCLUDING A SPRING PLATE AND AN INSULATING LAYER

(71) Applicant: LG INNOTEK CO., LTD., Seoul (KR)

(72) Inventors: Duck Hoon Park, Seoul (KR); Jee Heum Paik, Seoul (KR); Young Joon Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 544 days.

(21) Appl. No.: 17/426,763

(22) PCT Filed: Feb. 6, 2020

(86) PCT No.: PCT/KR2020/001704
§ 371 (c)(1),
(2) Date: Jul. 29, 2021

(87) PCT Pub. No.: WO2020/162688
PCT Pub. Date: Aug. 13, 2020

(65) Prior Publication Data
US 2022/0102417 A1 Mar. 31, 2022

(30) Foreign Application Priority Data
Feb. 7, 2019 (KR) .................. 10-2019-0014398

(51) Int. Cl.
*H01L 27/146* (2006.01)
*H04N 23/55* (2023.01)
(52) U.S. Cl.
CPC .. *H01L 27/14636* (2013.01); *H01L 27/14625* (2013.01); *H01L 27/14634* (2013.01); *H04N 23/55* (2023.01)

(58) Field of Classification Search
CPC ........... H04N 23/54–55; H04N 23/682; H04N 23/685; H04N 23/687; H05K 2201/10121;
(Continued)

(56) References Cited

U.S. PATENT DOCUMENTS 7,675,566 B2   3/2010   Tagome et al.
8,605,160 B2  12/2013   Kwon et al.
(Continued)

FOREIGN PATENT DOCUMENTS

CN   101133352 A   2/2008
CN   102971670 A   3/2013
(Continued)

*Primary Examiner* — Steven M Christopher
*Assistant Examiner* — Tyler J Wiegand
(74) *Attorney, Agent, or Firm* — Birch, Stewart, Kolasch & Birch, LLP

(57) ABSTRACT

An image sensor substrate according to an embodiment includes: an insulating layer; and a conductive pattern part disposed on the insulating layer, wherein the insulating layer includes: a first insulating part: and a second insulating part disposed surrounding a periphery of the first insulating part and spaced apart from the first insulating part with a first open region interposed therebetween, and the conductive pattern part includes: a first conductive pattern part disposed on the first insulating part; a second conductive pattern part disposed on the second insulating part; and an extension pattern part disposed on the first open region and interconnecting the first and second conductive pattern parts, wherein the extension pattern part includes a bent portion disposed on a corner region of the first open region.

18 Claims, 13 Drawing Sheets

(58) Field of Classification Search
CPC ......... H05K 2201/10151; H05K 2201/10265; H05K 2201/1028–10287; H05K 1/117–118; H05K 1/148; H05K 1/165; H05K 1/186–189

See application file for complete search history.

(56) References Cited

U.S. PATENT DOCUMENTS

| | | | |
|---|---|---|---|
| 8,611,735 | B2 | 12/2013 | Sekimoto |
| 8,982,256 | B2 | 3/2015 | Tobinaga et al. |
| 9,451,167 | B2 | 9/2016 | Lee |
| 9,736,377 | B2 | 8/2017 | Lee |
| 10,020,347 | B2 | 7/2018 | Enoki et al. |
| 10,033,303 | B2 | 7/2018 | Liu et al. |
| 10,516,348 | B2 | 12/2019 | Liu et al. |
| 10,830,980 | B2 | 11/2020 | Park et al. |
| 10,924,675 | B2 | 2/2021 | Hubert et al. |
| 11,089,221 | B2 | 8/2021 | Sasaki et al. |
| 2008/0158412 | A1* | 7/2008 | Tagome ............... H04N 23/54 348/374 |
| 2013/0039640 | A1 | 2/2013 | Sekimoto |
| 2013/0107068 | A1 | 5/2013 | Kim et al. |
| 2013/0107115 | A1 | 5/2013 | Tobinaga et al. |
| 2015/0062706 | A1 | 3/2015 | Lim et al. |
| 2015/0212291 | A1 | 7/2015 | Lee |
| 2015/0341534 | A1 | 11/2015 | Ng et al. |
| 2016/0323487 | A1 | 11/2016 | Lee |
| 2017/0133950 | A1 | 5/2017 | Liu et al. |
| 2017/0133951 | A1 | 5/2017 | Liu et al. |
| 2018/0171991 | A1 | 6/2018 | Miller et al. |
| 2019/0020822 | A1 | 1/2019 | Sharma et al. |
| 2019/0141248 | A1* | 5/2019 | Hubert ............... H04N 23/687 |
| 2020/0035408 | A1* | 1/2020 | Lee ..................... G02B 7/09 |
| 2020/0144936 | A1 | 5/2020 | Liu et al. |
| 2020/0260011 | A1 | 8/2020 | Sasaki et al. |
| 2022/0086317 | A1 | 3/2022 | Paik et al. |

FOREIGN PATENT DOCUMENTS

| | | |
|---|---|---|
| CN | 103649827 A | 3/2014 |
| CN | 104808416 A | 7/2015 |
| CN | 108351573 A | 7/2018 |
| CN | 108474924 A | 8/2018 |
| CN | 108602663 A | 9/2018 |
| CN | 108780207 A | 11/2018 |
| JP | 2013-72967 A | 4/2013 |
| KR | 10-0646560 B1 | 11/2006 |
| KR | 10-2007-0007742 A | 1/2007 |
| KR | 10-2014-0073238 A | 6/2014 |
| KR | 10-2017-0021682 A | 2/2017 |
| KR | 10-2017-0112096 A | 10/2017 |
| KR | 10-2018-0081087 A | 7/2018 |
| TW | 201423972 A | 6/2014 |
| WO | WO 2017/158462 A1 | 9/2017 |
| WO | WO 2020/145650 A1 | 7/2020 |

\* cited by examiner

[FIG. 1]
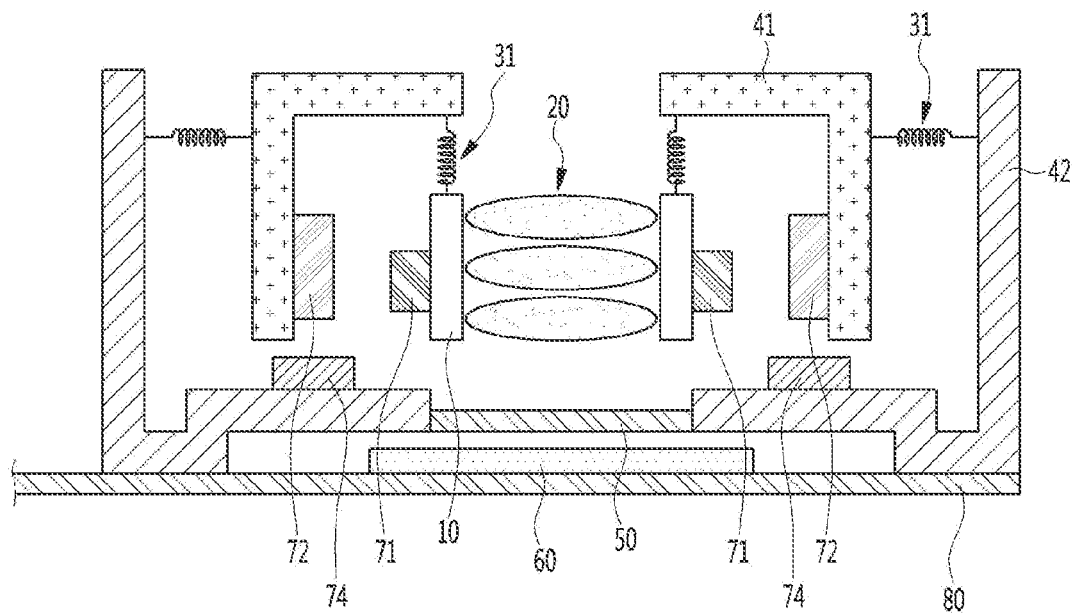
[FIG. 2]
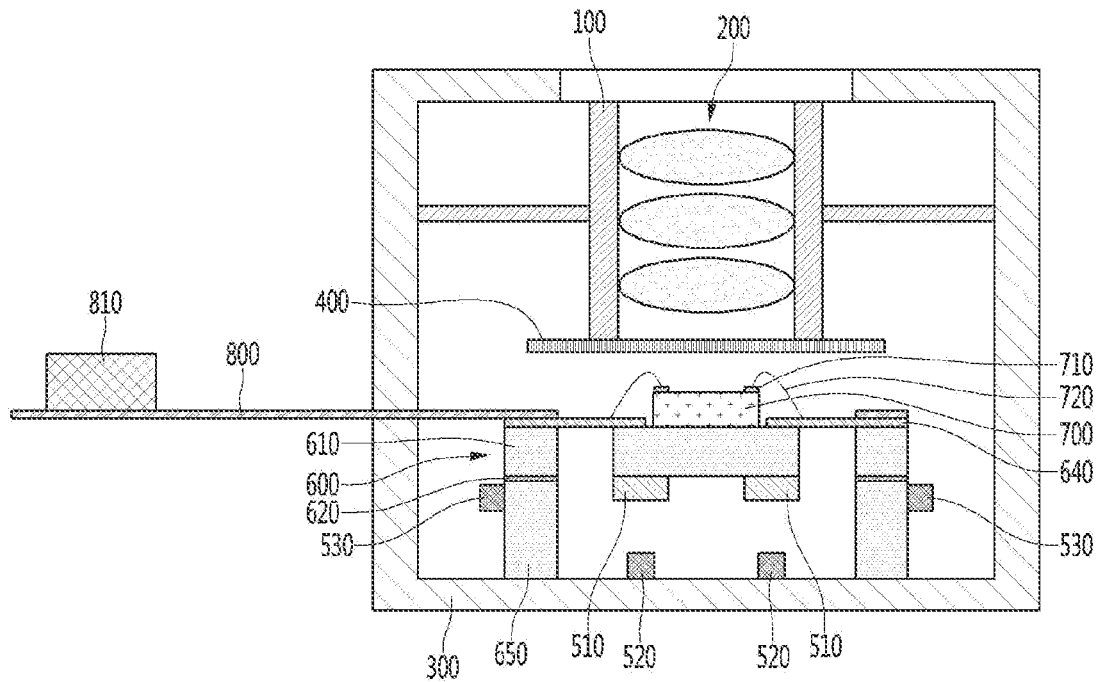

【FIG. 3】
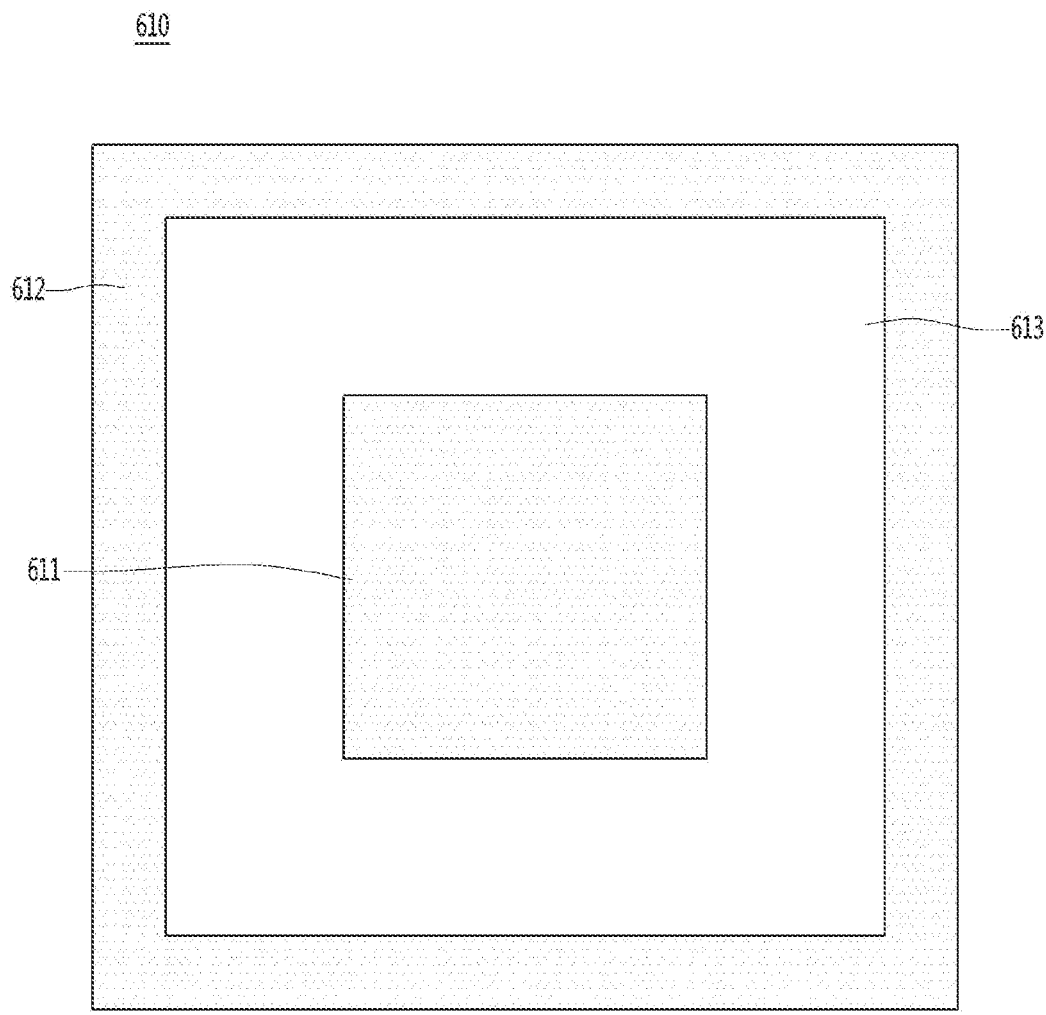

[FIG. 4]
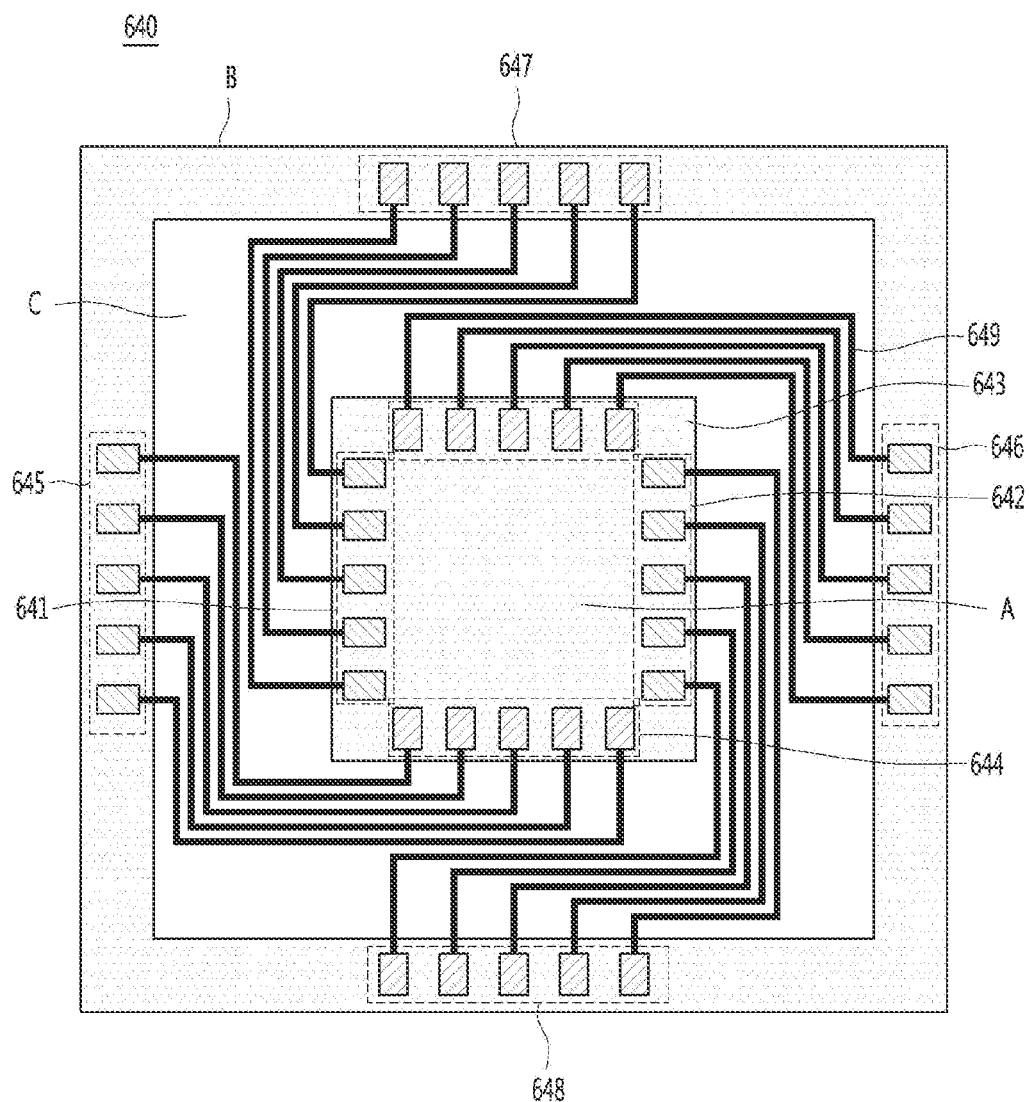

【FIG. 5】
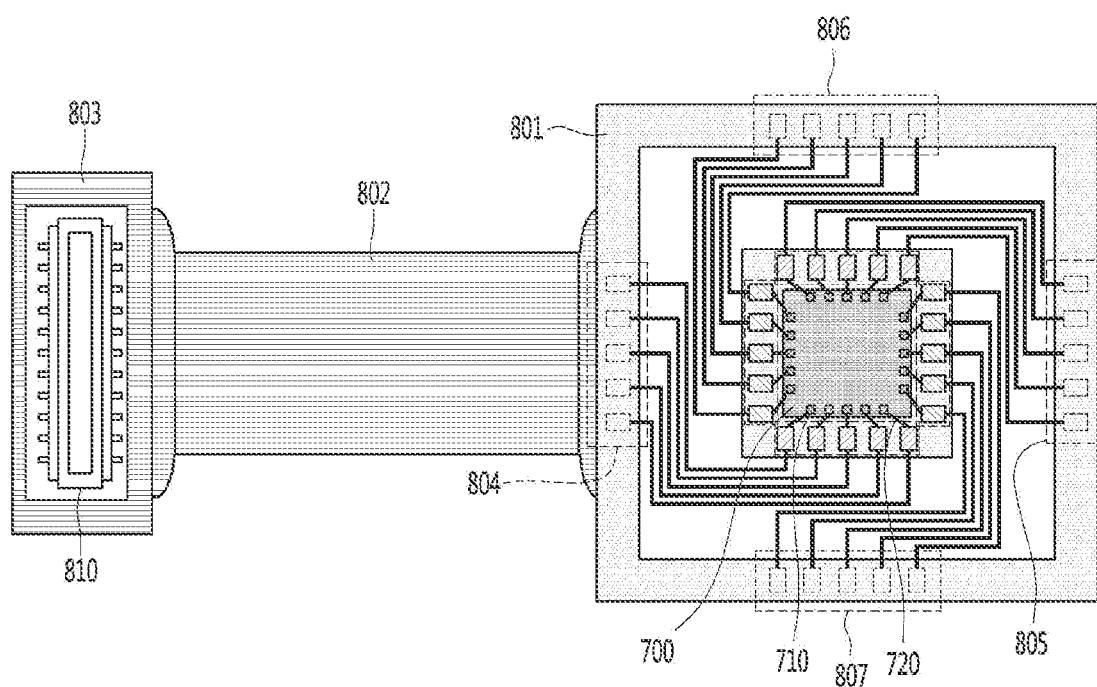
【FIG. 6】
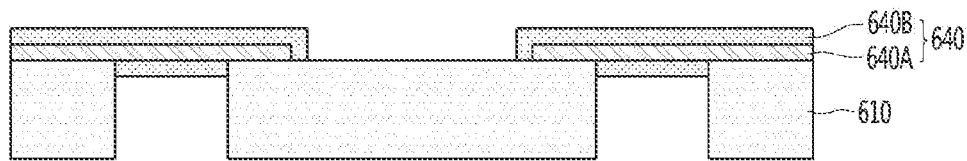

[FIG. 7]
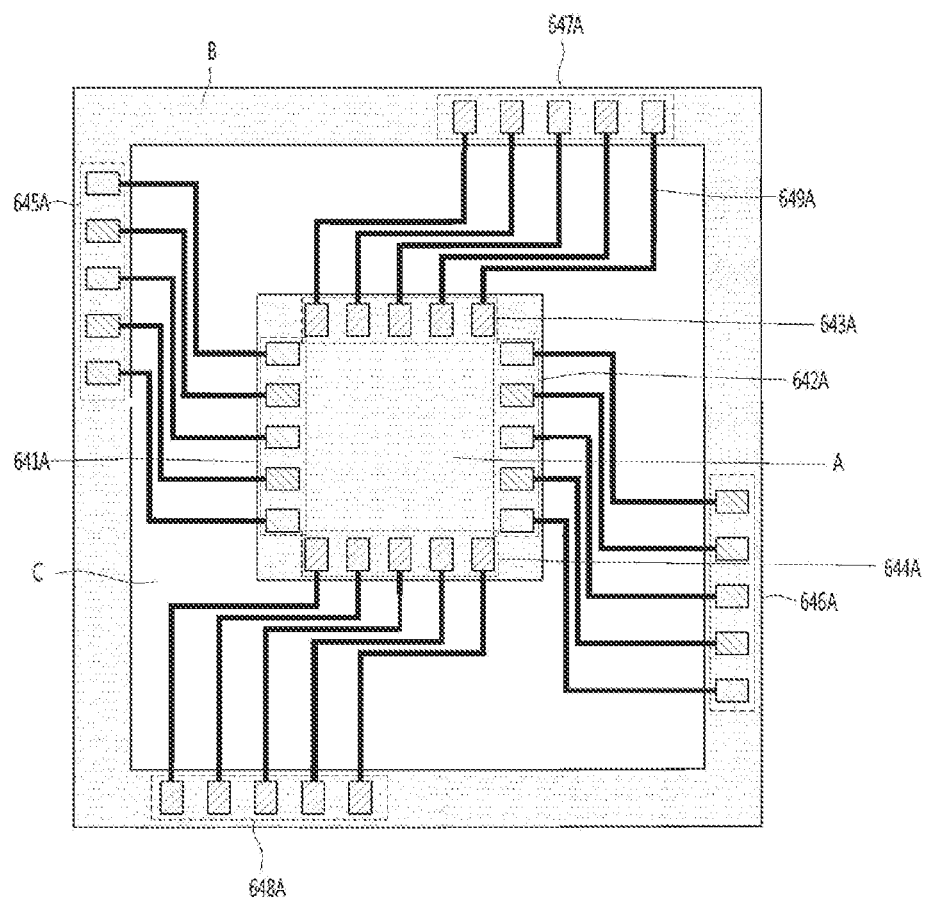

[FIG. 8]
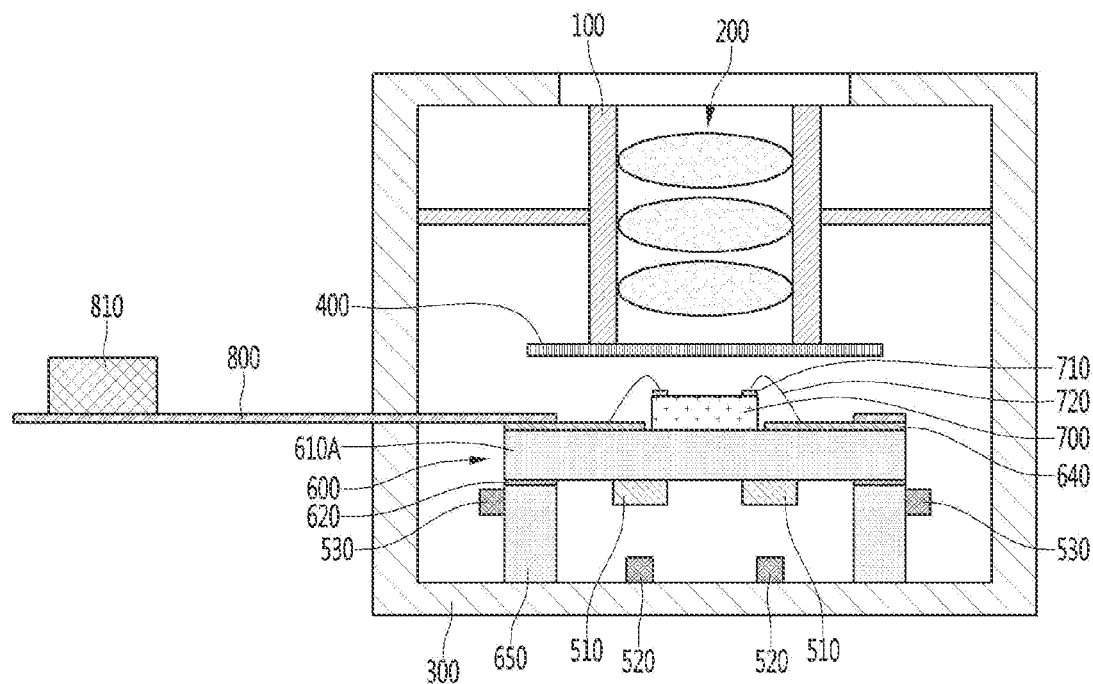

[FIG. 9]
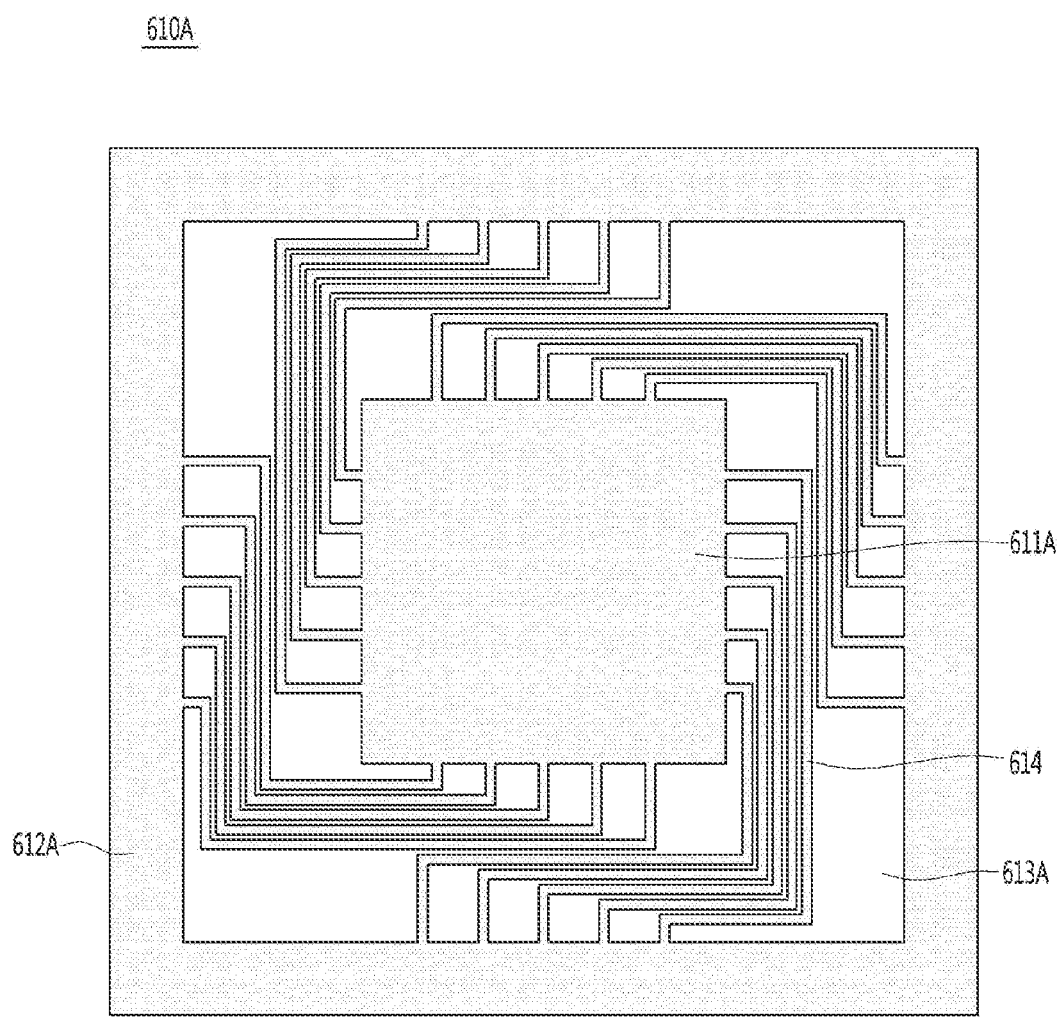

【FIG. 10】
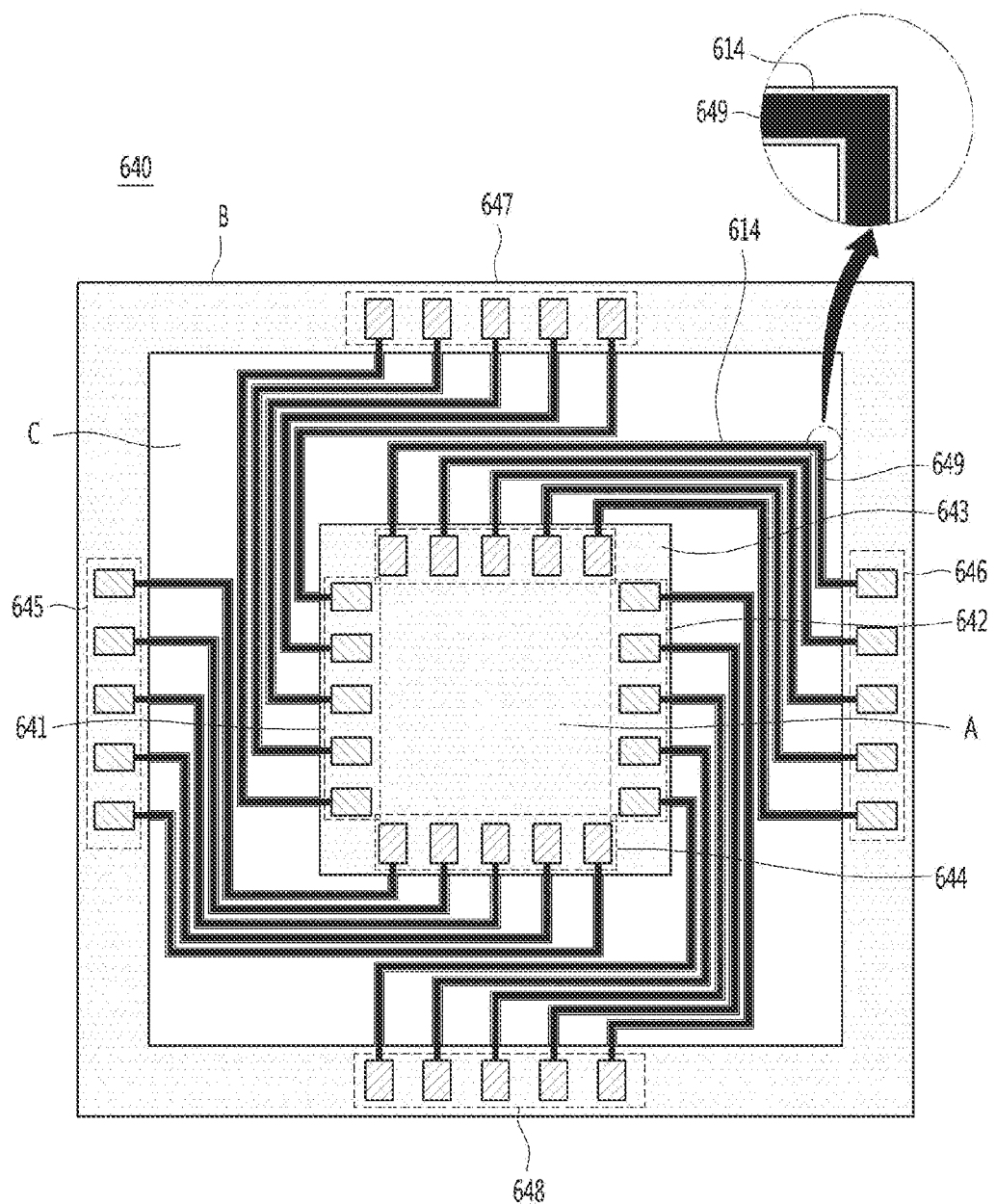

[FIG. 11]
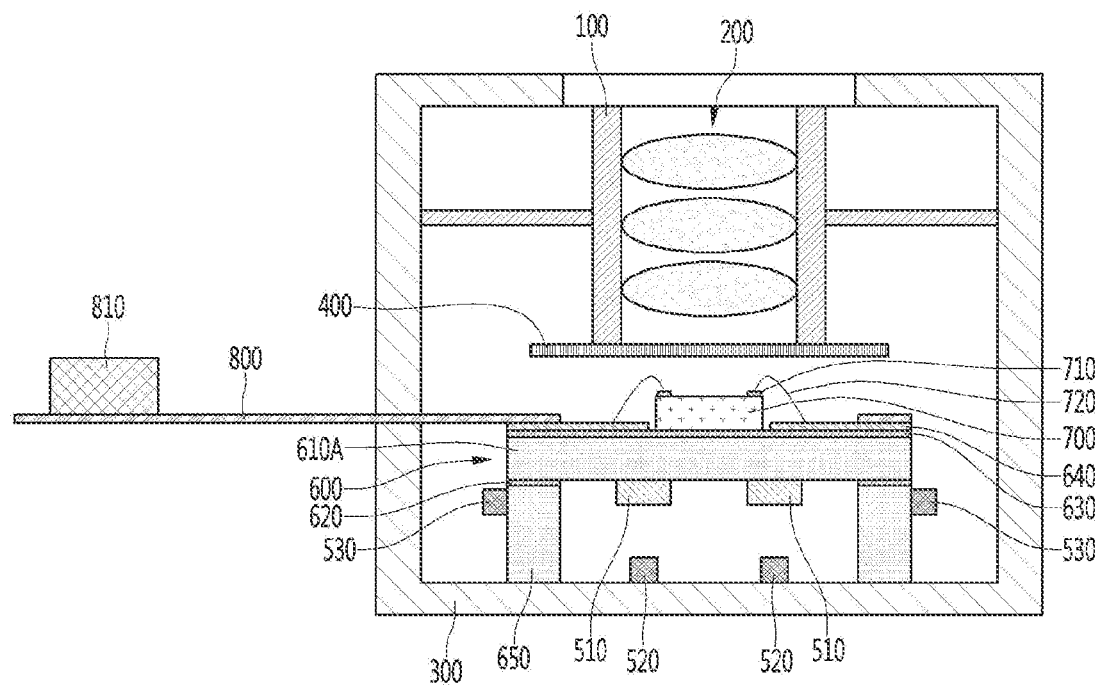

[FIG. 12]
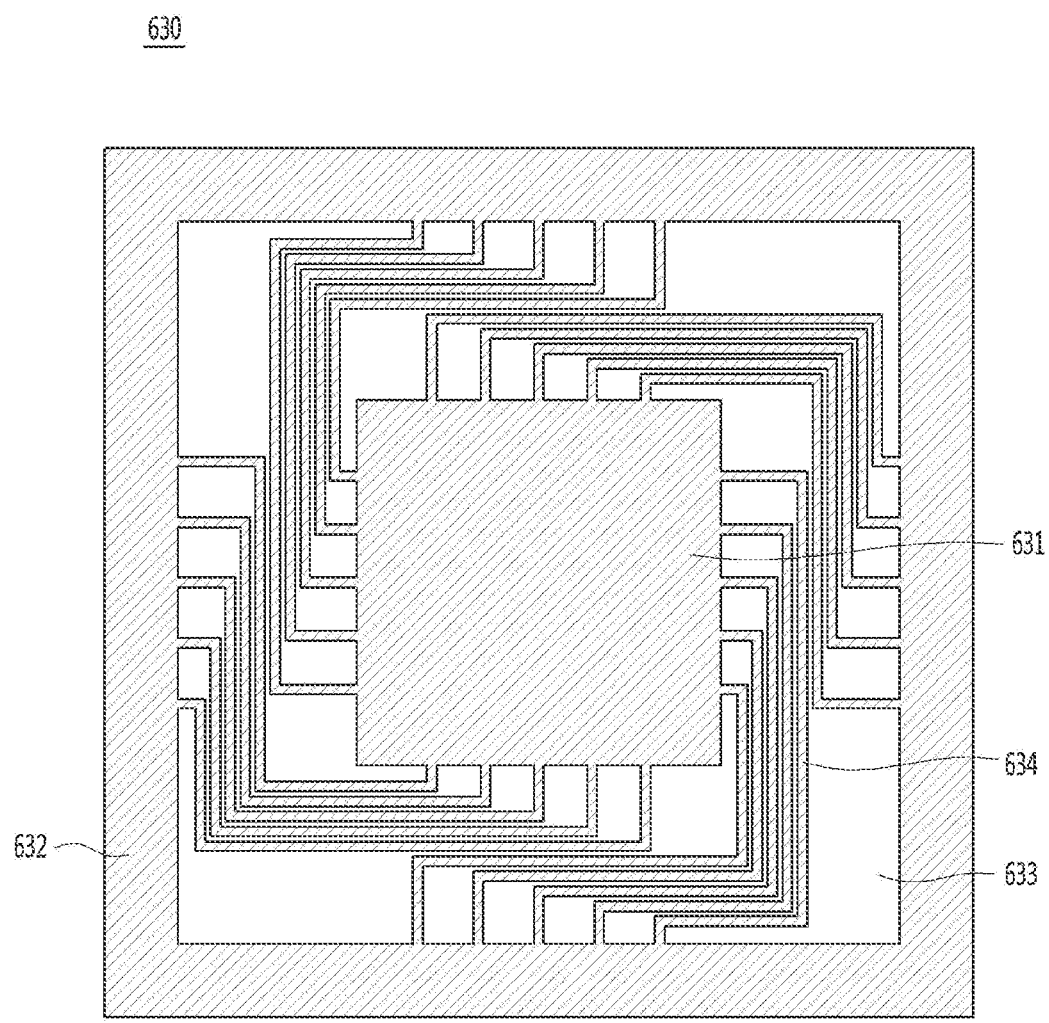

[FIG. 13]
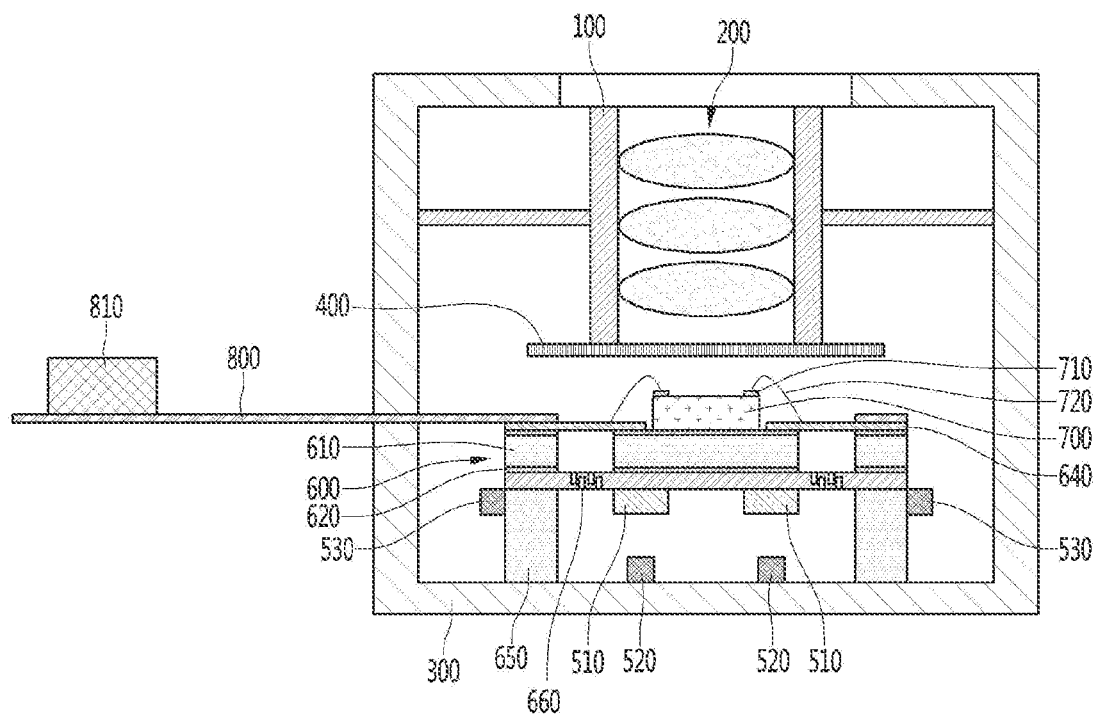

[FIG. 14]
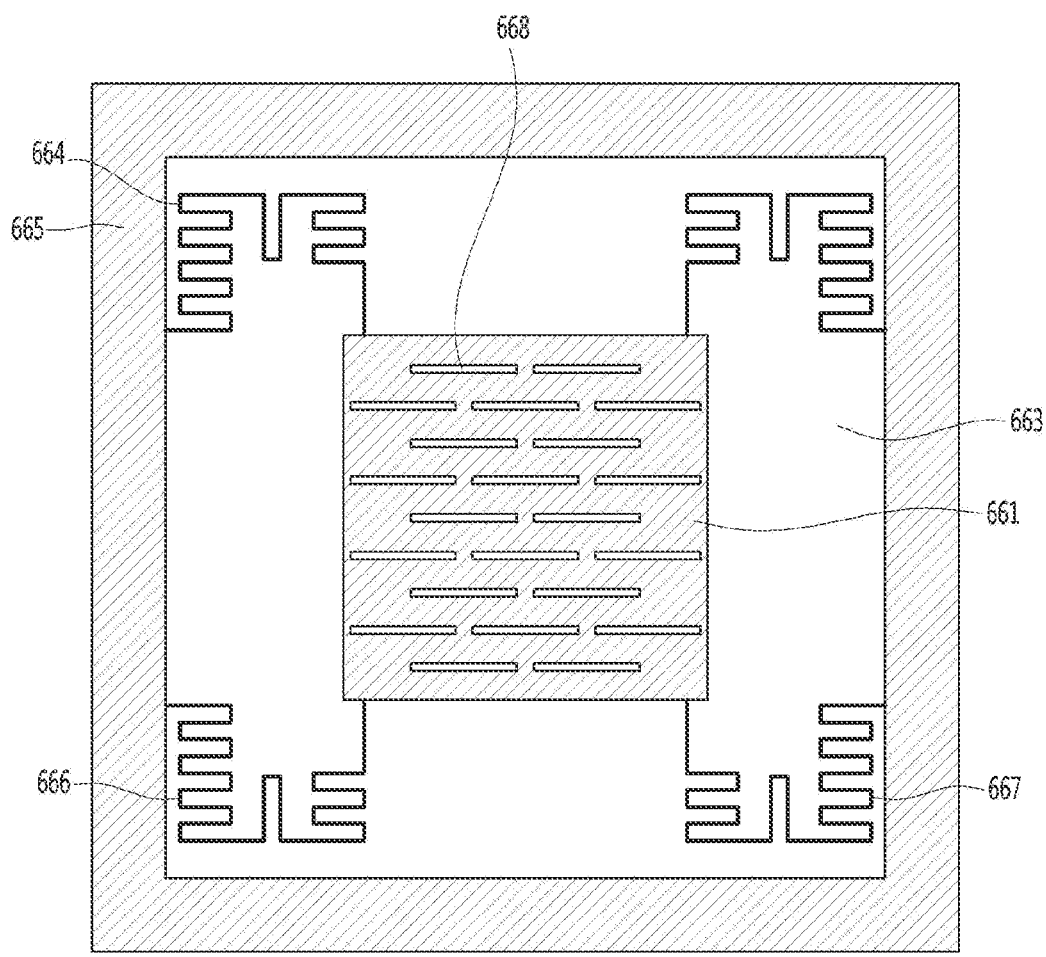

[FIG. 15]
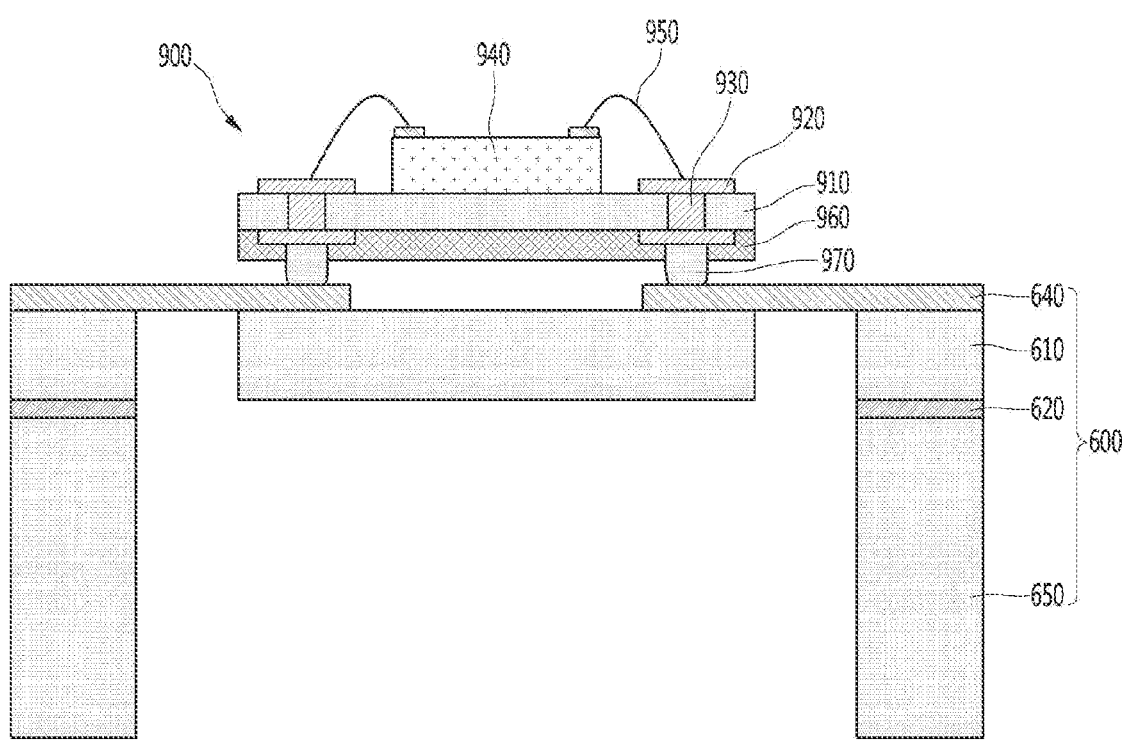

SUBSTRATE FOR IMAGE SENSOR INCLUDING A SPRING PLATE AND AN INSULATING LAYER

CROSS REFERENCE TO RELATED APPLICATIONS

This application is the National Phase of PCT International Application No. PCT/KR2020/001704, filed on Feb. 6, 2020, which claims priority under 35 U.S.C. 119(a) to Patent Application No. 10-2019-0014398, filed in the Republic of Korea on Feb. 7, 2019, all of which are hereby expressly incorporated by reference into the present application.

TECHNICAL FIELD

Embodiments relate to an image sensor substrate, and more particularly to an image sensor substrate that may be relatively moved around a lens barrel and a camera module including the same.

BACKGROUND ART

In general, a camera device is mounted on an automobile, an endoscope, and an electronic device such as a CCTV, in addition to a portable device such as a mobile communication terminal and an MP3 player. Such a camera device has been gradually developed with a focus on high pixels, and has been reduced in size and thickness. Not only that, current camera devices are changing so that a variety of additional functions can be realized at low production costs.

The above-described camera device includes a lens barrel for accommodating a lens, a lens holder coupled with the lens barrel, an image sensor disposed in the lens holder, and a driving substrate on which the image sensor is mounted. In this case, the lens transmits an image signal of a subject to the image sensor. Then, the image sensor converts the video signal into an electric signal.

Here, accuracy of the video signal at the camera device is determined according to a focal length defined as a distance between the lens and the image sensor.

Accordingly, the camera device provided focus correction or shake compensation by moving the lens barrel relative to the image sensor. That is, in the camera device, the lens barrel accommodating the lens was moved relative to the image sensor in an X-axis, a Y-axis, and a Z-axis. At this time, the camera device required at least six elastic members such as springs to relatively move the lens barrel. In addition, each elastic member was coupled with the lens barrel by a method like bonding.

However, the camera device according to the related art as described above is composed of an upper spring plate disposed above the lens barrel, a lower spring plate disposed below the lens barrel, and a structure such as an elastic wire for fixing the Z-axis due to relative movement of the lens barrel, and thus there is a problem that the module structure of the camera device is complicated.

In addition, the camera device according to the related art requires a plurality of elastic members for moving the lens barrel, and thus there is a problem that the number of assembly processes for the plurality of elastic members increases.

DISCLOSURE

Technical Problem

In an embodiment, it is possible to provide an image sensor substrate having a new structure, and a camera module including the same.

In addition, in an embodiment, it is possible to provide an image sensor substrate in which an image sensor is relatively movable with respect to a lens barrel, and a camera module including the same.

Further, in an embodiment, it is possible to provide an image sensor substrate that can perform tilt correction as well as X-axis, Y-axis and Z-axis movement, and a camera module including the same.

Furthermore, in an embodiment, it is possible to provide an image sensor substrate that can simplify a spring structure for providing an autofocus function and a handshake compensation function and a camera module including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

An image sensor substrate according to an embodiment includes: an insulating layer; and a conductive pattern part disposed on the insulating layer, wherein the insulating layer includes: a first insulating part: and a second insulating part disposed surrounding a periphery of the first insulating part and spaced apart from the first insulating part with a first open region interposed therebetween, and the conductive pattern part includes: a first conductive pattern part disposed on the first insulating part; a second conductive pattern part disposed on the second insulating part; and an extension pattern part disposed on the first open region and interconnecting the first and second conductive pattern parts, wherein the extension pattern part includes a bent portion disposed on a corner region of the first open region.

In addition, the first conductive pattern part is located on each of a plurality of regions of the first insulating part, and the second conductive pattern part is located on each of a plurality of regions of the second insulating part facing the plurality of regions, and the extension pattern part connects between the first conductive pattern part disposed on a first region of the first insulating part and the second conductive pattern part disposed on a second region of the second insulating part, and the first and second regions do not face each other.

In addition, a length of the extension pattern part is larger than a linear distance between the first conductive pattern part and the second conductive pattern part disposed in a region facing each other.

Further, the length of the extension pattern part has a range of 1.5 times to 20 times a linear distance between the first conductive pattern part and the second conductive pattern part disposed in a region facing each other.

Furthermore, the extension pattern part includes at least one metal material selected from gold (Au), silver (Ag), palladium (Pd), titanium (Ti), tin (Sn), copper (Cu), and zinc (Zn).

In addition, the insulating layer includes an extension insulating part disposed on the first open region, and the extension insulating part is overlapped with the extension pattern part in a vertical direction.

Further, a width of the extension insulating part is larger than that of the extension pattern part.

In addition, a bonding sheet between the insulating layer and the conductive pattern part, wherein the bonding sheet includes: a first bonding part between the first insulating part and the first conductive pattern part; a second bonding part between the second insulating part and the second conductive pattern part; and an extension bonding part between the extension insulating part and the extension pattern part Further, the extension pattern part is disposed while floating on the first open region.

Furthermore, the extension pattern part includes a metal layer and a plating layer on the metal layer, and the plating layer is disposed surrounding side and lower surfaces of the extension pattern part disposed on the first open region.

In addition, the image sensor substrate includes a spring plate disposed under the insulating layer and including a second open region overlapped with the first open region, wherein the spring plate includes: a first plate part; a second plate part spaced apart from the first plate part with the second open region interposed therebetween; and an elastic member disposed on the second open region and connecting the first and second plate parts.

In addition, the first open region includes: a first open part; and a second open part connected to the first open part with the corner region interposed therebetween, the extension pattern part includes: a first portion disposed on the first open part and connected to the first conductive pattern part; and a second portion disposed on the second open part and connected to the second conductive pattern part, and the bent portion connects the first and second portions on the corner region.

Meanwhile, a camera module includes: a housing; a lens barrel disposed in the housing; a lens assembly disposed in the lens barrel; an image sensor substrate disposed in the housing; an image sensor disposed on the image sensor substrate; a first driver disposed at a lower surface of the image sensor substrate; and a second driver disposed at the housing, wherein the image sensor substrate includes an insulating layer and a conductive pattern part disposed on the insulating layer, wherein the insulating layer includes a first insulating part and a second insulating part disposed surrounding a periphery of the first insulating part and spaced apart from the first insulating part with a first open region interposed therebetween, and the conductive pattern part includes a first conductive pattern part disposed on the first insulating part, a second conductive pattern part disposed on the second insulating part, and an extension pattern part disposed on the first open region and interconnecting the first and second conductive pattern parts, wherein the extension pattern part includes a bent portion disposed on a corner region of the first open region.

In addition, the first conductive pattern part is located on each of a plurality of regions of the first insulating part, and the second conductive pattern part is located on each of a plurality of regions of the second insulating part facing the plurality of regions, and the extension pattern part connects between the first conductive pattern part disposed on a first region of the first insulating part and the second conductive pattern part disposed on a second region of the second insulating part, and the first and second regions do not face each other.

Meanwhile, a camera device according to an embodiment includes a housing; a lens barrel disposed in the housing; a lens assembly disposed in the lens barrel; an image sensor substrate disposed in the housing; an image sensor disposed on the image sensor substrate; and a flexible circuit board including a first connector portion disposed in the housing and electrically connected to the image sensor substrate, a second connector portion disposed outside the housing and electrically connected to an external device, and a connection portion connecting the first and second connector portions, wherein the image sensor substrate includes an insulating layer and a conductive pattern part disposed on the insulating layer, wherein the insulating layer includes a first insulating part and a second insulating part disposed surrounding a periphery of the first insulating part and spaced apart from the first insulating part with a first open region interposed therebetween, and the conductive pattern part includes a first conductive pattern part disposed on the first insulating part, a second conductive pattern part disposed on the second insulating part, and an extension pattern part disposed on the first open region and interconnecting the first and second conductive pattern parts, wherein the first conductive pattern part is located on each of a plurality of regions of the first insulating part, the second conductive pattern part is located on each of a plurality of regions of the second insulating part facing the plurality of regions, the extension pattern part connects between the first conductive pattern part disposed on a first region of the first insulating part and the second conductive pattern part disposed on a second region of the second insulating part, which does not face the first region, and the extension pattern part includes a bent portion disposed on a corner region of the first open region.

Advantageous Effects

According to the embodiment, in order to realize an optical image stabilizer (OIS) function and an Auto Focusing (AF) function of the camera module, instead of moving the conventional lens barrel, the image sensor is moved relative to the lens barrel in the X-axis, Y-axis, and Z-axis directions. Accordingly, the camera module according to the embodiment may remove a complicated spring structure for realizing the OIS and AF functions, thereby simplifying a structure. In addition, the structure that is more stable than the existing one may be formed by moving the image sensor according to the embodiment relative to the lens barrel.

In addition, according to the embodiment, the extension pattern part for electrically connecting the image sensor and the flexible circuit board has a spring structure and is disposed to be floated on the insulating layer. In this case, the extension pattern part serves as a circuit for transmitting a signal between the image sensor and the flexible circuit board and a spring for moving the image sensor in the X, Y, and Z axes. Accordingly, the camera module according to the embodiment may remove a structure such as a spring plate required to move the image sensor, and accordingly, manufacturing process may be facilitated by eliminating a process related to the spring plate.

In addition, according to the embodiment, in disposing the extension pattern part that functions as a spring, instead of connecting between the first lead pattern part and the second lead pattern part disposed in a region facing a region disposed in the first lead pattern part, the first lead pattern part and the second lead pattern part disposed in a region intersecting with the region in which the first lead pattern part is disposed are connected. Accordingly, the extension pattern part in the embodiment has a form disposed while rotating in a tilt direction of the image sensor. Accordingly, in the embodiment, a tilt operation of the image sensor may be stably performed using the extension pattern part.

In addition, in the embodiment, the extension pattern portion is disposed on the insulation layer, and the insulation layer may include an extension insulating part having a shape corresponding to the extension pattern part in a region vertically overlapped with the extension pattern part. Accordingly, the camera module may move the image sensor relative to the lens barrel while supporting the image sensor more stably and elastically.

In addition, a length of the extension pattern part in the embodiment has at least 1.5 times to 20 times a linear distance between the first lead pattern part and the second lead pattern part facing each other. Accordingly, it is possible to minimize noise generation while improving the mobility of the image sensor substrate.

In addition, a width of the extension insulation part in the embodiment is set to be larger than that of the extension pattern part, so that the extension pattern part may be stably supported by the extension insulation part, thereby improving operation reliability.

DESCRIPTION OF DRAWINGS

FIG. 1 is a view showing a camera module according to a comparative example.

FIG. 2 is a view illustrating a camera device according to a first embodiment.

FIG. 3 is a view showing an insulating layer illustrated in FIG. 2.

FIG. 4 is a view showing a conductive pattern part according to one embodiment.

FIG. 5 is a view showing a connection structure between a flexible circuit board and an image sensor substrate according to an embodiment.

FIG. 6 is a view for specifically describing a layer structure of a conductive pattern part according to an embodiment.

FIG. 7 is a modified example of the conductive pattern part of FIG. 4.

FIG. 8 is a view illustrating a camera device according to a second embodiment.

FIG. 9 is a plan view of an insulating layer of FIG. 8 as viewed from above.

FIG. 10 is a plan view of an image sensor substrate of FIG. 9.

FIG. 11 is a view illustrating a camera device according to a third embodiment.

FIG. 12 is a view showing a second bonding sheet illustrated in FIG. 11.

FIG. 13 is a view illustrating a camera device according to a fourth embodiment.

FIG. 14 is a view showing a spring plate illustrated in FIG. 13.

FIG. 15 shows an attaching structure of an image sensor on an image sensor substrate according to another embodiment.

MODES OF THE INVENTION

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, embodiments of the present disclosure will be described in detail with reference to the accompanying drawings.

FIG. 1 is a view showing a camera module according to a comparative example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and drivers 71, 72, 73, and 74.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable. The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in the X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, an image sensor substrate, a camera module, and a camera device including the same according to an embodiment will be described.

FIG. 2 is a view illustrating a camera device according to a first embodiment.

Referring to FIG. 2, the camera device according to the embodiment includes a lens barrel 100, a lens assembly 200, a housing 300, an infrared cut-off filter 400, drivers 510, 520, and 530, an image sensor substrate 600, an image sensor 700, and a flexible circuit board 800.

The lens barrel 100 accommodates the lens assembly 200.

The lens barrel 100 may include an accommodating groove for accommodating the lens assembly 200. The accommodating groove may have a shape corresponding to the lens assembly 200.

The lens barrel 100 may have a rectangular tube shape or a cylindrical shape. That is, the outer periphery of the lens barrel 100 may have a rectangular tube shape or a cylindrical shape, but the embodiment is not limited thereto.

The lens barrel 100 is connected to the housing 300. The lens barrel 100 is accommodated in the housing 300. The lens barrel 100 may be coupled to the housing 300 by a separate coupling member (not shown).

The lens barrel 100 may include an open region in an upper portion thereof. Preferably, the lens barrel 100 may include a light entrance groove that is open to an object side. The light entrance groove may expose the lens assembly 200. In addition, an image may be incident on the lens assembly 200 via the light entrance groove.

The lens assembly 200 is disposed in the lens barrel 100. The lens assembly 200 is accommodated in the accommodating groove provided in the lens barrel 100. The lens assembly 200 may be inserted into and fixed to the accommodating groove of the lens barrel 100. The lens assembly 200 may have a circular outer shape. For example, the lens assembly 200 may have a circular shape when viewed from a top side, but the embodiment is not limited thereto. That is, the lens assembly 200 may have a rectangular shape when viewed from the top side.

The lens assembly 200 includes a plurality of lenses. For example, the lens assembly 200 may include first to fourth lenses. The first to fourth lenses may be sequentially stacked. In addition, a spacer (not shown) may be interposed between the lenses. The spacer may space a distance between the lenses constant. In the above, the lens assembly 200 has been described as including four lenses, but the embodiment is not limited thereto. For example, the lens assembly 200 may include one to three lenses, or may include five or more lenses.

The housing 300 accommodates the lens barrel 100. The housing 300 fixes a position of the lens barrel 100 via a separate fixing member (not shown). That is, according to the comparative example, the lens barrel is coupled to be movable with respect to the housing. Unlike this, in an embodiment, the housing 300 may be firmly fixed via the fixing member such that the lens barrel 100 does not move in the housing 300. Accordingly, the position of the lens barrel 100 in the housing 300 is always fixed. Accordingly, in the embodiment, since the lens barrel 100 is always fixed at the same position, it is possible to solve a problem of distortion of an optical axis caused by warping of the lens barrel, etc., thereby improving reliability.

The housing 300 may be formed of plastic or metal. The housing 300 may have a rectangular tube shape.

The infrared cut-off filter 400 may be disposed at a lower end of the lens barrel 100. The infrared cut-off filter 400 may be fixedly disposed on a separate substrate (not shown), and accordingly, it may be coupled to the lens barrel 100. The infrared cut-off filter 400 may block light having an excessive long wavelength flowing into the image sensor 700.

The infrared cut-off filter 400 may be formed by alternately depositing titanium oxide and silicon oxide on an optical glass. In this case, thicknesses of the titanium oxide and the silicon oxide constituting the infrared cut-off filter 400 may be appropriately adjusted in order to block infrared rays.

The drivers 510, 520, and 530 move the image sensor substrate 600 relative to the fixed lens barrel 100. The drivers 510, 520, and 530 move the image sensor substrate 600 relative to the fixed housing 300. The drivers 510, 520, and 530 move the image sensor substrate 600 relative to the fixed lens assembly 200.

To this end, the drivers 510, 520, and 530 may move the image sensor substrate 600 relative to magnetic force. The drivers 510, 520, and 530 may include a first driver 510, a second driver 520, and a third driver 530.

The first driver 510 is attached to the image sensor substrate 600. Preferably, the first driver 510 may be attached to a lower surface of the image sensor substrate 600. More preferably, the first driver 510 may be attached to a lower surface of the insulating layer 610 constituting the image sensor substrate 600. The first driver 510 may include a magnet. For example, the first driver 510 may include a permanent magnet. In this case, the magnet constituting the first driver 510 may have a plate shape. Accordingly, the first driver 510 may include an upper surface, a lower surface, and side surfaces.

The second driver 520 may be disposed on a bottom surface of the housing 300. Preferably, the second driver 520 may be disposed on the bottom surface of the housing 300 overlapped with the image sensor substrate 600 in a vertical direction. The second driver 520 may include a coil. The second driver 520 may receive a driving signal and generate a magnetic field according to the driving signal.

In this case, the first driver 510 and the second driver 520 may face each other. That is, the first driver 510 and the second driver 520 may be disposed to be overlapped with each other in the vertical direction. The first driver 510 and the second driver 520 may be disposed side by side in the horizontal direction. That is, the lower surface of the first driver 510 and an upper surface of the second driver 520 may be disposed to face each other. A separation distance between the first driver 510 and the second driver 520 may be 50 µm to about 1000 µm, but the embodiment is not limited thereto.

Magnetic force may be generated between the first driver 510 and the second driver 520. Accordingly, the image sensor substrate 600 may move in the X-axis direction and the Y-axis direction by repulsion force or attraction force generated between the second driver 520 and the first driver 510. In addition, the image sensor substrate 600 may be tilted (or rotated) according to a change in a direction of a current applied to the second driver 520. To this end, the second driver 520 and the first driver 510 may each include a plurality of magnets and a plurality of coils.

The third driver 530 may be attached to the image sensor substrate 600. Preferably, the third driver 530 may be attached to a side wall of the image sensor substrate 600. In detail, the third driver 530 may be attached to a side surface of the support layer 650 of the image sensor substrate 600. In this case, at least a portion of the third driver 530 may be disposed to be overlapped with the first driver 510 in the horizontal direction. The third driver 530 may be disposed perpendicular to the first driver 510. That is, an upper surface of the third driver 530 may be disposed to face the side surface of the first driver 510. Accordingly, the image sensor substrate 600 may move in the Z-axis direction by attraction force and repulsion force between the third driver 530 and the first driver 510.

The image sensor substrate 600 is a substrate on which the image sensor 700 is mounted. In detail, the image sensor substrate 600 may be driven by the drivers 510, 520, and 530 to move the image sensor 700 in the X, Y, and Z-axis directions. In addition, the image sensor substrate 600 may be driven by the drivers 510, 520, and 530 to tilt the image sensor 700.

The image sensor substrate 600 may be disposed to be spaced apart from the bottom surface of the housing 300 by a predetermined distance. In addition, the image sensor substrate 600 may move the mounted image sensor 700 relative to the housing 300.

To this end, the image sensor substrate 600 may include an insulating layer 610, a first bonding sheet 620, a conductive pattern part 640, and a support layer 650.

The insulating layer 610 may support the conductive pattern part 640, and may move the image sensor 700 disposed on the image sensor substrate 600 in the X, Y, and Z-axis directions. To this end, the insulating layer 610 may include an elastic region having a predetermined elastic force.

Specifically, the insulating layer 610 is a substrate for forming the conductive pattern part 640, and may include all of printing, a wiring plate, and an insulating substrate which are made of an insulating material capable of forming the conductive pattern part 640 at a surface of the insulating layer.

The insulating layers 610 may be rigid or flexible. For example, the insulating layer 610 may include glass or plastic. Specifically, the insulating layer 610 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 610 may include an optically isotropic film. For example, the insulating layer 610 may include cyclic olefin copolymer (COC), cyclic olefin polymer (COP), optically isotropic PC, optically isotropic polymethylmethacrylate (PMMA), etc.

In this case, the insulating layer 610 may be partially bent while having a curved surface. That is, the insulating layer 610 may partially have a plane and may partially be bent while having a curved surface. In addition, the insulating layer 610 may be a flexible substrate having flexibility. Further, the insulating layer 610 may be a curved or bent substrate.

The conductive pattern part 640 is disposed on the insulating layer 610. The conductive pattern part 640 may include lead pattern parts spaced apart from each other by a predetermined distance on the insulating layer 610. For example, the conductive pattern part 640 may include a first lead pattern part connected to the image sensor 700 and a second lead pattern part connected to the flexible circuit board 800. In addition, the conductive pattern part 640 may include an extension pattern part connecting the first lead pattern part and the second lead pattern part. The first lead pattern part, the second lead pattern part, and the extension pattern part will be described in detail below.

The conductive pattern part 640 is a wiring for transmitting an electrical signal, and may be formed of a metal material having high electrical conductivity. For this, the conductive pattern part 640 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the conductive pattern part 640 serves as a wiring for transmitting an electrical signal, and may be formed of a metallic material having an elastic force movable in the X-axis, Y-axis, and Z-axis directions by the force applied from the drivers 510, 520, and 530. To this end, the conductive pattern part 640 may be formed of a metal material having a tensile strength of 1000 MPa or more. For example, the conductive pattern part 640 may be a binary alloy or ternary alloy containing copper. For example, the conductive pattern part 640 may be a binary alloy of copper (Cu)-nickel (Ni). For example, the conductive pattern part 640 may be a binary alloy of copper (Cu)-tin (Sn). For example, the conductive pattern part 640 may be a binary alloy of copper (Cu)-beryllium (Be). For example, the conductive pattern part 640 may be a binary alloy of copper (Cu)-cobalt (Co). For example, the conductive pattern part 640 may be a ternary alloy of copper (Cu)-nickel (Ni)-tin (Sn). For example, the conductive pattern part 640 may be a ternary alloy of copper (Cu)-beryllium (Be)-cobalt (Co). In addition, in addition to the metal material, the conductive pattern part 640 may be formed of an alloy of iron (Fe), nickel (Ni), zinc, and the like having an elastic force capable of acting as a spring and having good electrical characteristics. Further, the conductive pattern part 640 may be surface-treated with a plating layer containing a metal material such as gold (Au), silver (Ag), palladium (Pd), and the like, thereby improving electrical conductivity.

Meanwhile, the conductive pattern part 640 may be formed by a general process of manufacturing a printed circuit board, such as an additive process, a subtractive process, a modified semi additive process (MSAP), a semi additive process (SAP), etc., and detailed descriptions thereof will be omitted herein.

The support layer 650 may be a support substrate.

The support layer 650 may be disposed under the insulating layer 610 to support the insulating layer 610, the conductive pattern part 640, and the image sensor 700. In this case, the first bonding sheet 620 may be disposed between the support layer 650 and the insulating layer 610.

The first bonding sheet 620 may be selectively disposed in a region overlapped with the lower surface of the insulating layer 610 in a vertical direction on an upper surface of the support layer 650.

The third driver 530 may be mounted on the support layer 650, thereby applying an electrical signal to the third driver 530. The support layer 650 may support the insulating layer 610. Preferably, the support layer 650 may support the first bonding sheet 620, the insulating layer 610, the conductive pattern part 640, and the image sensor 700 at a floating position from the bottom surface of the housing 300.

The image sensor 700 is disposed on the image sensor substrate 600. Preferably, the image sensor 700 is disposed on the conductive pattern part 640 of the image sensor substrate 600. The image sensor 700 may be mounted on the first lead pattern part constituting the conductive pattern part 640 of the image sensor substrate 600.

The image sensor 700 may be composed of a charge coupled device (CCD) or a complementary metal oxide semiconductor (CMOS) sensor, and may be a device that outputs a photographed object using a photoelectric conversion element and a charge coupled element as an electrical signal. The image sensor 700 may be electrically connected to the conductive pattern part 640 on the image sensor substrate 600, and receive an image provided from the lens assembly 200. In addition, the image sensor 700 may convert the received image into an electrical signal and output the electrical signal. In this case, a signal output through the image sensor 700 may be transmitted to the flexible circuit board 800 via the conductive pattern part 640.

One end of the flexible circuit board 800 may be connected to the image sensor substrate 600. The flexible circuit board 800 may receive an electrical signal output from the image sensor 700. The flexible circuit board 800 may include a connector at the other end. The connector may be connected to a main substrate (not shown).

That is, the flexible circuit board 800 may connect between a camera module and a main substrate of an external device. In detail, the flexible circuit board 800 may connect between the conductive pattern part 640 of the image sensor substrate 600 of the camera module and a main substrate of a portable terminal.

To this end, one region of the flexible circuit board 800 may be disposed inside the housing 300, and may be connected to the conductive pattern part 640 of the image sensor substrate 600 accordingly.

Hereinafter, the image sensor substrate 600 according to an embodiment will be described in more detail.

FIG. 3 is a view illustrating the insulating layer shown in FIG. 2.

Referring to FIG. 3, the insulating layer 610 may support the conductive pattern part 640 constituting the image sensor substrate 600.

The insulating layer 610 may include a first insulating part 611 and a second insulating part 612 spaced apart from the first insulating part 611.

The insulating layer 610 may include an open region 613 between the first insulating part 611 and the second insulating part 612.

The second insulating part 612 is disposed surrounding a periphery of the first insulating part 611 at a position spaced apart from the first insulating part 611 by a predetermined distance. In this case, the second insulating part 612 is not in direct contact with the first insulating part 611. Therefore, the first insulating part 611 and the second insulating part 612 may be separated from each other by the open region 613.

Meanwhile, the open region 613 of the insulating layer 610 may be overlapped with an extension pattern part (to be described later) constituting the conductive pattern part 640 in a vertical direction. Therefore, the extension pattern part exposed through the open region 613 may be floated on the insulating layer 610.

The insulating layer 610 may have a thickness of 20 μm to 100 μm. For example, the insulating layer 610 may have a thickness of 25 μm to 50 μm. For example, the insulating layer 610 may have a thickness of 30 μm to 40 μm. When the thickness of the insulating layer 610 exceeds 100 μm, the overall thickness of the image sensor substrate 600 may increase. When the thickness of the insulating layer 610 is less than 20 μm, it may be difficult to dispose the image sensor 700. When the thickness of the insulating layer 610 is less than 20 μm, it may be weak against heat/pressure, or the like in a process of mounting the image sensor, and thus it may be difficult to mount the image sensor 700 stably.

Meanwhile, although it is illustrated in the drawing that the first insulating part 611 and the second insulating part 612 of the insulating layer 610 have a structure that is physically completely separated with the open region 613 interposed therebetween, according to an embodiment, a connection insulating part (not shown) may be disposed in the open region 613. The connection insulating part is a portion that is partially left without removing the entire open region 613 at the time of forming the open region 613, and may connect between the first insulating part 611 and the second insulating part 612. For example, the connection insulating part may connect corner regions of the first insulating part 611 and the second insulating part 612 to each other. For example, the connection insulating part may connect a first corner region of the first insulating part 611 and a second corner region of the second insulating part 612 corresponding to the first corner region to each other. In addition, the connection insulating part may connect remaining other corner regions of the first insulating part 611 and remaining other corner regions of the second insulating part 612 corresponding thereto.

When the insulating layer 610 includes the connection insulating part, the first insulating part 611, the second insulating part 612, and the connection insulating part may be integrally formed. Through this, the elastic force of the insulating layer 610 when the image sensor is tilted may be utilized, and it is possible to prevent the first insulating part 611, the connection insulating part, and the second insulating part 612 from being detached from one another.

The insulating layer 610 may have the open region 613 by removing a region corresponding to the open region 613 on one insulating member by etching or physical punching.

Meanwhile, at least one slit (not shown) may be formed on the first insulating part 611 of the insulating layer 610. The slit may be formed to maintain flatness of the insulating layer 610. That is, the conductive pattern part 640 and the image sensor 700 are disposed on the insulating layer 610. In addition, the first driver 510 is disposed under the insulating layer 610. In this case, flatness of the first driver 510 or the image sensor 700 directly affects the reliability of the camera module, and the image quality may be deteriorated as the flatness is worsen, Therefore, in the embodiment, not only the weight of the insulating layer 610 may be reduced but also the flatness may be maintained by forming at least one slit on the insulating layer 610, thereby improving overall reliability of the camera module.

Meanwhile, the first bonding sheet 620 is disposed under the insulating layer 610. In this case, the first bonding sheet 620 may be disposed under the second insulating part 612 of the insulating layer 610. Accordingly, the first bonding sheet 620 may have a planar shape corresponding to the planar shape of the second insulating part 612 of the insulating layer 610.

In other words, the first bonding sheet 620 may be selectively formed only in a region in which the support layer 650 is disposed on the lower surface of the insulating layer 610. Meanwhile, the support layer 650 and the insulating layer 610 may be formed integrally with each other. Accordingly, the first bonding sheet 620 may be selectively omitted.

That is, the support layer 650 may be formed by removing a part of the lower surface of the insulating member constituting the insulating layer 610 and the support layer 650 to form a groove.

The first bonding sheet 620 may expose the open region 613 and the first insulating part 611 of the insulating layer 610.

The first bonding sheet 620 may be formed of a double-sided adhesive film. The first bonding sheet 620 may be composed of an epoxy or, an acrylic adhesive or a thermosetting adhesive film.

The first bonding sheet 620 may have a thickness of 25 μm.

FIG. 4 is a view illustrating a conductive pattern part according to one embodiment.

Referring to FIG. 4, the conductive pattern part 640 may be disposed on the insulating layer 610 with a specific pattern. The conductive pattern part 640 may include first conductive pattern parts 641, 642, 643, and 644 disposed on the first insulating part 611 of the insulating layer 610, second conductive pattern parts 645, 646, 647 and 648 disposed on the second insulating part 612 of the insulating layer 610, and an extension pattern part 649 disposed on the open region 613 of the insulating layer 610.

In this case, in the drawing, an upper region of the first insulating part 611 of the insulating layer 610 is referred to as 'A', an upper region of the second insulating part 612 of the insulating layer 610 is referred to as 'B', and a region vertically overlapped with the open region 613 of the insulating layer 610 is referred to as 'C'.

The first conductive pattern parts 641, 642, 643, and 644 may be disposed on the first insulating part 611 of the insulating layer 610. Preferably, the first conductive pattern parts 641, 642, 643, and 644 may be disposed in an edge region of the first insulating part 611. In this case, a part of an upper surface of the first insulating part 611 may be used as a mounting region in which the image sensor 700 is mounted, and accordingly, the first conductive pattern parts 641, 642, 643, and 644 may be disposed surrounding a periphery of the mounting region in an outer region of the upper surface of the first insulating part 611.

The first conductive pattern parts 641, 642, 643, and 644 may be disposed around four sides of the upper surface of the first insulating part 611, respectively. Therefore, the first conductive pattern parts 641, 642, 643, and 644 may include a first-first conductive pattern part 641 disposed in a first side region of the first insulating part 611, a first-second conductive pattern part 642 disposed in a second side region facing the first side region, a first-third conductive pattern part 643 disposed in a third side region between the first side region and the second side region, and a first-fourth conductive pattern part 644 disposed in a fourth side region facing the third side region.

In addition, the second conductive pattern parts 645, 646, 647, and 648 may be disposed around four sides of an upper surface of the second insulating part 612, respectively. In this case, the second conductive pattern parts 645, 646, 647, and 648 may be disposed on the second insulating part 612 facing the second conductive pattern parts 645, 646, 647, and 648. A number of the second conductive pattern parts 645, 646, 647, and 648 may be the same as that of the first conductive pattern parts 641, 642, 643, and 644. Therefore, the first conductive pattern parts 641, 642, 643, and 644 may be connected one-to-one with the second conductive pattern parts 645, 646, 647, and 648.

Preferably, the second conductive pattern parts 645, 646, 647, and 648 may include a second-first conductive pattern part 645 disposed in a first side region of the second insulating part 612 facing the first-first conductive pattern part 641, a second-second conductive pattern part 646 disposed in a second side region of the second insulating part 612 facing the first-second conductive pattern part 642, a second-third conductive pattern part 647 disposed in a third side region of the second insulating part 612 facing the first-third conductive pattern part 643, and a second-fourth conductive pattern part 648 disposed in a fourth side region of the second insulating part 612 facing the first-fourth conductive pattern part 644.

Here, the first side regions of the first insulating part 611 and the second insulating part 612 may be a left region of an upper surface of the insulating layer 610. The second side regions of the first insulating part 611 and the second insulating part 612 may be a right region of the upper surface of the insulating layer 610. In addition, the third side regions of the first insulating part 611 and the second insulating part 612 may be an upper region of the upper surface of the insulating layer 610. Further, the fourth side regions of the first insulating part 611 and the second insulating part 612 may be a lower region of the upper surface of the insulating layer 610.

As described above, the first conductive pattern parts 641, 642, 643, and 644 and the second conductive pattern parts 645, 646, 647, and 648 may be respectively disposed on surfaces facing each other on the first insulating part 611 and the second insulating part 612.

In addition, the first conductive pattern parts 641, 642, 643, and 644 and the second conductive pattern parts 645, 646, 647, and 648 are disposed in different regions of the first insulating part 611 and the second insulating part 612, respectively, thereby increasing the elastic supporting force in movement of the image sensor substrate 600. That is, when the conductive pattern part 640 is intensively disposed only in a specific region, the reliability in the movement of the image sensor substrate 600 in a specific direction may be deteriorated. For example, when the first conductive pattern part 640 includes only the first-first and the first-second conductive pattern parts 641 and 643, there is no problem in moving the image sensor substrate 600 in the X-axis direction, but stability may be reduced in the movement in the Y-axis direction. Further, in such a case, the conductive pattern part 640 may be short-circuited according to periodic movement of the image sensor substrate 600. Therefore, in the embodiment, as described above, the conductive pattern parts 640 are separately disposed in four regions, so that the image sensor substrate 600 may be stably moved in the X-axis, the Y-axis, and the Z-axis. That is, the conductive pattern part may be formed to be symmetrical up/down/left/right on the insulating layer 610.

Meanwhile, the first conductive pattern parts 641, 642, 643, and 644 may be an inner lead pattern part connected to the image sensor 700, and the second conductive pattern parts 645, 646, 647, and 648 may be an outer lead pattern part connected to the flexible circuit board 800.

Meanwhile, the conductive pattern part 640 may include an extension pattern part 649 that is disposed floatingly on the open region 613 of the insulating layer 610 while connecting between the first conductive pattern parts 641, 642, 643, and 644 and the second conductive pattern parts 645, 646, 647, and 648. Here, the floating may refer to a state in which the extension pattern part 649 is floating in the air without a support portion supporting the extension pattern part 649 at a lower portion thereof.

In conclusion, the first conductive pattern parts 641, 642, 643, and 644 and the second conductive pattern parts 645, 646, 647, and 648 may be disposed so as to face each other on the insulating layer 610. The extension pattern part 649 may connect the first conductive pattern parts 641, 642, 643, and 644 and the second conductive pattern parts 645, 646, 647, and 648 to each other.

In this case, one end of the extension pattern part 649 may be connected to the first conductive pattern parts 641, 642, 643, and 644, and the other end thereof may be connected to the second conductive pattern parts 645, 646, 647, and 648. Preferably, the extension pattern part 649 may not connect the first conductive pattern part and the second conductive pattern part that face each other, but may connect the first conductive pattern part and the second conductive pattern part that do not face each other.

For example, one end of the extension pattern part 649 may be connected to the first-first conductive pattern part 641, and the other end thereof may be connected to the second-third conductive pattern part 647 instead of the second-first conductive pattern part 645 facing the first-first conductive pattern part 641. That is, the extension pattern part 649 does not connect one of the first conductive pattern parts 641, 642, 643, and 644 and one of the second conductive pattern parts 645, 646, 647, and 648 disposed in parallel directions to each other, but may connect one of the first conductive pattern parts 641, 642, 643, and 644 and one of the second conductive pattern parts 645, 646, 647, and 648 disposed in directions crossing each other.

That is, when one end of the extension pattern part 649 is connected to the first-first conductive pattern part 641, the other end thereof may be connected to the second-third pattern part 647 or the second-fourth pattern part 648 disposed in a direction crossing the first-first conductive pattern part 641.

Therefore, the extension pattern part 649 may be disposed in a form of rotating along a corner region on the open region 613.

In addition, the extension pattern part 649 may be disposed on a plurality of side regions.

For example, when the extension pattern part 649 connects between the first conductive pattern part and the second conductive pattern part facing each other, the extension pattern part 649 may be disposed only in the one side region facing each other.

Alternatively, in the embodiment, since the extension pattern part 649 connects the first conductive pattern part and the second conductive pattern part that do not face each other, the extension pattern part 649 may be disposed on a side region in which the first conductive pattern part to which one end thereof is connected is disposed and on a side region in which the second conductive pattern part to which the other end thereof is connected is disposed, respectively. That is, the extension pattern part 649 has a plurality of bent structures, and may be disposed along one corner region on the open region 613.

The open region of the insulating layer 610 may include first to fourth open parts. The first open part may be located between a first outer side of the first insulating part 611 and a first inner side of the second insulating part 612. The second open part may be located between a second outer side of the first insulating part 611 and a second inner side of the second insulating part 612. The third open part may be located between a third outer side of the first insulating part 611 and a third inner side of the second insulating part 612. The fourth open part may be located between a fourth outer side of the first insulating part 611 and a fourth inner side of the second insulating part 612. The first open part and the second open part may face each other. In addition, the third open part may be disposed between one end of the first open part and one end of the second open part to connect them to each other. Further, the fourth open part may be disposed between the other end of the first open part and the other end of the second open part to connect them to each other.

In addition, the first-first conductive pattern part 641 and the second-first conductive pattern part 645 may be disposed to face each other with the first open part therebetween. The first-second conductive pattern part 642 and the second-second conductive pattern part 646 may be disposed to face each other with the second open part therebetween. The first-third conductive pattern part 643 and the second-third conductive pattern part 647 may be disposed to face each other with the third open part therebetween. The first-fourth conductive pattern part 644 and the second-fourth conductive pattern part 648 may be disposed to face each other with the fourth open part therebetween.

In addition, the extension pattern part 619 may not connect the first conductive pattern parts 641, 642, 643, and 644 and the second conductive pattern parts 645, 646, 647, and 648 disposed on the same open part to each other, but may connect the first conductive pattern parts 641, 642, 643, and 644 and the second conductive pattern parts 645, 646, 647, and 648 disposed on different opening parts.

For example, the extension pattern part 619 may connect the first-first conductive pattern part 641 disposed on the first open part and the second-third conductive pattern part 647 disposed on the third open part to each other. The extension pattern part 619 may connect the first-second conductive pattern part 642 disposed on the second open part and the second-fourth conductive pattern part 648 disposed on the fourth open part to each other. The extension pattern part 619 may connect the first-third conductive pattern part 643 disposed on the third open part and the second-second conductive pattern part 646 disposed on the second open part to each other. The extension pattern part 619 may connect the first-fourth conductive pattern part 641 disposed on the fourth open part and the second-first conductive pattern part 645 disposed on the first open part to each other. Accordingly, the extension pattern part 619 may be disposed on a corner region between the plurality of open parts. That is, the extension pattern part 619 may include a bent portion disposed on the corner region connecting between the open part at which a start end is disposed and the open part at which the end is disposed.

In conclusion, the extension pattern part 649 may have a shape that rotates in a first direction, and may include a plurality of extension pattern parts for connecting the first conductive pattern parts 641, 642, 643, and 644 and the second conductive pattern parts 645, 646, 647, and 648 to each other. In addition, rotation directions of the plurality of extension pattern parts may be the same. Further, lengths of the plurality of extension pattern parts may be the same. Accordingly, in the embodiment, not only the image sensor may be stably moved but also it is possible to have a rotation shape as described above, thereby realizing a stable tilt function.

Meanwhile, a length of the extension pattern part 649 is larger than a linear distance between the first conductive pattern part and the second conductive pattern part facing each other.

In this case, the extension pattern part 649 may be formed by etching so as to have a shape as described above through an additive process, a subtractive process, a modified semi additive process (MSAP), a semi additive process (SAP), etc. Preferably, the first conductive pattern parts 641, 642, 643, and 644, the second conductive pattern parts 645, 646, 647, and 648, and the extension pattern part 649 may be formed at the same time. More preferably, the extension pattern part 649 may be integrally formed with the first conductive pattern parts 641, 642, 643, and 644 and the second conductive pattern parts 645, 646, 647, and 648.

Meanwhile, a thickness of the conductive pattern part 640 including the first conductive pattern parts 641, 642, 643, and 644, the second conductive pattern parts 645, 646, 647, and 648, and the extension pattern part 649 may be 10 μm to 50 μm. For example, the thickness of the conductive pattern part 640 may be 30 μm to 40 μm. In this case, when the thickness of the conductive pattern part 640 is less than 10 μm, the conductive pattern part 640 may be broken when the image sensor substrate 600 moves. In addition, when the thickness of the conductive pattern part 640 is greater than 50 μm, elastic force of the extension pattern part 649 may be lowered, thereby hindering the mobility of the image sensor substrate 600. Accordingly, in the embodiment, the thickness of the conductive pattern part 640 is set to be 35 μm±5 μm such that the image sensor substrate 600 may be stably moved.

In addition, the length of the extension pattern part 649 is set to be at least 1.5 times or more the linear distance between the first conductive pattern part and the second conductive pattern part facing each other. In addition, the length of the extension pattern part 649 is set to be 20 times or less the linear distance between the first conductive pattern part and the second conductive pattern part facing each other.

In this case, the linear distance between the first conductive pattern parts 641, 642, 643, and 644 and the second conductive pattern parts 645, 646, 647, and 648 facing each other may be 1.5 mm.

In this case, when the length of the extension pattern part 649 is smaller than 1.5 times the linear distance, the mobility of the image sensor substrate 600 may be reduced due to the decrease in the elastic force of the extension pattern part 649. In addition, when the length of the extension pattern part 649 is greater than 20 times the linear distance, a resistance increases as a signal transmission distance is increased by the extension pattern part 649, and accordingly, noise may be included in a signal transmitted via the extension pattern part 649. Accordingly, in order to minimize noise generation, the length of the extension pattern part 649 is set to be 10 times or less the linear distance between the first lead pattern part 645 and the second lead pattern part 646.

Meanwhile, the conductive pattern part 640 as described above is a wiring for transmitting an electrical signal, and may be formed of a metal material having high electrical conductivity. For this, the conductive pattern part 640 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the conductive pattern part 640 serves as a wiring for transmitting an electrical signal, and may be formed of a metallic material having an elastic force movable in the X-axis, Y-axis, and Z-axis directions by the force applied from the drivers 510, 520, and 530. To this end, the conductive pattern part 640 may be formed of a metal material having a tensile strength of 1000 MPa or more. For example, the conductive pattern part 640 may be a binary alloy or ternary alloy containing copper. For example, the conductive pattern part 640 may be a binary alloy of copper (Cu)-nickel (Ni). For example, the conductive pattern part 640 may be a binary alloy of copper (Cu)-tin (Sn). For example, the conductive pattern part 640 may be a binary alloy of copper (Cu)-beryllium (Be). For example, the conductive pattern part 640 may be a binary alloy of copper (Cu)-cobalt (Co). For example, the conductive pattern part 640 may be a ternary alloy of copper (Cu)-nickel (Ni)-tin (Sn). For example, the conductive pattern part 640 may be a ternary alloy of copper (Cu)-beryllium (Be)-cobalt (Co). In addition, in addition to the metal material, the conductive pattern part 640 may be formed of an alloy of iron (Fe), nickel (Ni), zinc, and the like having an elastic force capable of acting as a spring and having good electrical characteristics. Further, the conductive pattern part 640 may be surface-treated with a plating layer containing a metal material such as gold (Au), silver (Ag), palladium (Pd), and the like, thereby improving electrical conductivity.

FIG. 5 is a view showing a connection structure between a flexible circuit board and an image sensor substrate according to an embodiment.

Referring to FIG. 5, a flexible circuit board 800 electrically connects an image sensor substrate 600 and an external main substrate (not shown).

One end of the flexible circuit board 800 may be connected to the image sensor substrate 600. The flexible circuit board 800 may receive an electrical signal output from the image sensor 700. The flexible circuit board 800 may include a connector 810 at the other end. The connector 810 may be connected to a main substrate (not shown).

That is, the flexible circuit board 800 may connect between a camera module and a main substrate of an external device. In detail, the flexible circuit board 800 may connect between the conductive pattern part 640 of the image sensor substrate 600 of the camera module and a main substrate of a portable terminal.

To this end, one region of the flexible circuit board 800 may be disposed inside the housing 300, and may be connected to the conductive pattern part 640 of the image sensor substrate 600 accordingly.

That is, the flexible circuit board 800 may include a first connector part 801, a second connector part 803, and a connection part 802.

The first connector part 801 may be disposed inside the housing 300. The first connector part 801 may include a plurality of pad portions 804, 805, 806, and 807 connected to the conductive pattern part 640.

The first connector part 801 may be electrically connected to the second conductive pattern parts 645, 646, 647, and 648, that is, the outer lead pattern part of the conductive pattern part 640. That is, the plurality of pad portions 804, 805, 806, and 807 provided in the first connector part 801 may be electrically connected to the second conductive pattern parts 645, 646, 647, and 648.

To this end, the first connector part 801 may include the first pad portion 804 connected to the second-first conductive pattern part 645. In addition, the first connector part 801 may include the second pad portion 805 connected to the second-second conductive pattern part 646. Further, the first connector part 801 may include the third pad portion 806 connected to the second-third conductive pattern part 647. Furthermore, the first connector part 801 may include the fourth pad portion 807 connected to the second-fourth conductive pattern part 648.

In this case, the first connector part 801 has a shape corresponding to the second insulating part 612 of the insulating layer 610, and may be disposed surrounding an upper region the second conductive pattern parts 645, 646, 647, and 648 of the conductive pattern part 640, and the plurality of pad portions 804, 805, 806, and 807 may be disposed at a lower surface thereof.

The connection part 802 connects between the first connector part 801 and the second connector part 803. The connection part 802 may be partially disposed in the housing 300, and may extend therefrom to be exposed outside the housing 300.

The connector 810 connected to the main substrate of the terminal may be disposed in the second connector part 803.

Meanwhile, the image sensor 700 may be attached on the first insulating part 611 of the insulating layer 610. In this case, the image sensor 700 may be attached on the first insulating part 611 such that an electrode 710 faces upward.

In addition, a connection member 720 such as a metal wire may be formed between the electrode 710 of the image sensor 700 and the first conductive pattern parts 641, 642, 643, and 644 to electrically connect between the electrode of the image sensor and the conductive patterns 641, 642, 643, and 644.

FIG. 6 is a view for specifically describing a layer structure of a conductive pattern part according to an embodiment.

Referring to FIG. 6, the conductive pattern part 640 may be disposed on the insulating layer 610. In this case, the conductive pattern part 640 may include first conductive pattern parts 641, 642, 643, and 644 disposed on the first insulating part 611 of the insulating layer 610, second conductive pattern parts 645, 646, 647 and 648 disposed on the second insulating part 612, and an extension pattern part 649 disposed on the open region 613.

In this case, each of the first conductive pattern parts 641, 642, 643, and 644, the second conductive pattern parts 645, 646, 647 and 648, and the extension pattern part 649 may include a metal layer 640A and a plating layer 640B.

The metal layer 640A may be disposed on the insulating layer 610. That is, the metal layer 640A is disposed on the insulating layer 610, and the first conductive pattern parts 641, 642, 643, and 644, the second conductive pattern parts 645, 646, 647 and 648, and the extension pattern part 649 are formed, respectively.

The plating layer 640B may be disposed on the metal layer 640A. Preferably, the plating layer 640B may be a surface processing layer disposed on the metal layer 640A.

The plating layer 640B may include any one of a Ni/Au alloy, gold (Au), electroless nickel immersion gold (ENIG), a Ni/Pd alloy, and organic solderability preservative (OSP).

In this case, the plating layer 640B constituting the first conductive pattern parts 641, 642, 643, and 644 and the second conductive pattern parts 645, 646, 647, and 648 may correspond to each other. Alternatively, the plating layer 640B constituting the extension pattern part 649 may have a thickness different from that of plating layer 650B layer 640B constituting the first conductive pattern parts 641, 642, 643, and 644 and the second conductive pattern parts 645, 646, 647, and 648.

That is, the plating layer 640B of the first conductive pattern parts 641, 642, 643, and 644 and the second conductive pattern parts 645, 646, 647, and 648 may be selectively formed only on upper and side surfaces of the metal layer 640A. Alternatively, the metal layer 640A constituting the extension pattern part 649 is disposed in a floating state on the open region described above, and accordingly the plating layer 640B of the extension pattern part 649 may be formed surrounding a front surface of the metal layer 640A. That is, the plating layer 640B of the extension pattern part 649 may be formed surrounding upper, side, and lower surfaces of the metal layer 640A of the extension pattern part 649.

Therefore, a lower surface of the first conductive pattern parts 641, 642, 643, and 644 may be located on substantially the same plane as an upper surface of the insulating layer 610. Alternatively, a lower surface of the extension pattern part 649 may be located lower than the upper surface of the insulating layer 610.

Meanwhile, a thickness of the plating layer 640B may be 0.3 μm to 1 μm. For example, the thickness of the plating layer 640B may be 0.3 μm to 0.7 μm. The thickness of the plating layer 640B may be 0.3 μm to 0.5 μm.

FIG. 7 is a modified example of the conductive pattern part of FIG. 4.

In FIG. 4, the extension pattern part 649 constituting the conductive pattern part 640 connects the first and second conductive pattern parts respectively disposed on surfaces not facing each other, not the first and second conductive pattern parts facing each other.

Alternatively, according to FIG. 7, the conductive pattern part 640 may connect the first and second conductive pattern parts respectively disposed on surfaces facing each other.

However, in FIG. 7, second conductive pattern parts 645A, 646A, 647A, and 648A are not disposed facing the first conductive pattern parts 641, 642, 643, and 644, and may be disposed to be biased in a corresponding direction based on a bending direction of an extension pattern part 649A. That is, the second conductive pattern parts 645, 646, 647, and 648 may be disposed to be biased toward a corner region on the second insulating part. Accordingly, the extension pattern part 647 may include a bent portion disposed on the corner region on the open region 613 so as to be connected to the second conductive pattern parts 645, 646, 647, and 648 disposed to be biased toward the corner region.

That is, as shown in FIG. 7, the extension pattern part 649A may be disposed to be bent rightward. Accordingly, the second conductive pattern parts 645, 646, 647, and 648 may be disposed to be biased rightward from the center in respective disposition regions. That is, the second conductive pattern parts 645, 646, 647, and 648 may be disposed to be biased in a region adjacent to a right corner region in corresponding disposition regions. In such a case, the extension pattern part 649A may be configured to rotate rightward as shown in FIG. 4, and may have a windmill shape that entirely rotates rightward.

As described above, when the extension pattern part 649A is disposed not in the center but to be biased toward one corner region in the corresponding disposition region, the mobility of the image sensor may be improved while maintaining the length of the extension pattern part 649A optimally.

FIG. 8 is a view illustrating a camera device according to a second embodiment.

Referring to FIG. 8, the camera device according to the embodiment includes a lens barrel 100, a lens assembly 200, a housing 300, an infrared cut-off filter 400, drivers 510, 520, and 530, an image sensor substrate 600, an image sensor 700, and a flexible circuit board 800.

In this case, the camera device according to the second embodiment differs only in a structure of the image sensor substrate 600, and the other structures are the same in comparison with the camera device in FIG. 2, and thus, only the image sensor substrate 600 in the second embodiment will be described below.

The image sensor substrate 600 may include an insulating layer 610A, a first bonding sheet 620, a conductive pattern part 640, and a support layer 650.

In this case, in the image sensor substrate 600, a configuration other than the insulating layer 610A is substantially the same as the structure illustrated in FIGS. 2 to 4.

Therefore, the insulating layer 610A having a structure different from those of FIGS. 2 to 4 will be described below.

The insulating layer 610A may move the image sensor 700 disposed on the image sensor substrate 600 in the X, Y, and Z-axis directions while supporting the conductive pattern part 640. To this end, the insulating layer 610A may include an elastic region having a predetermined elastic force. Preferably, the insulating layer 610A may include a plurality of elastic regions. For example, the insulating layer 610A may include four elastic regions.

That is, at least one region of the insulating layer 610A may have a predetermined elastic force, and accordingly, the insulating layer 610 may move the image sensor substrate 600 in X-axis, Y-axis, and Z-axis directions while elastically supporting the image sensor substrate 600.

In this case, the insulating layer 610 is a substrate for forming the conductive pattern part 640, and may include all of printing, a wiring plate, and an insulating substrate which are made of an insulating material capable of forming the conductive pattern part 640 at a surface of the insulating layer.

In this case, the insulating layer 610A may include a first insulating part 611A in which the first conductive pattern parts 641, 642, 643, and 644 constituting the conductive pattern part 640 are disposed, a second insulating part 612A in which the second conductive pattern part 645, 646, 647, and 648 are disposed, and an extension insulating part in which the extension pattern part 649 is disposed.

FIG. 9 is a plan view of the insulating layer of FIG. 8 as viewed from above.

Referring to FIG. 9, the insulating layer 610A may elastically support the conductive pattern part 640 constituting the image sensor substrate 600.

The insulating layer 610A may have an elastic region having a predetermined elastic force in order to move the image sensor 700 disposed on the image sensor substrate 600 in the X-axis, Y-axis, and Z-axis directions.

To this end, the elastic region may include an extension insulating part 614 having elastic force of the insulating layer 610A. In detail, the first insulating part 611A may be disposed at the center of the insulating layer 610A. The second insulating part 612A may be disposed surrounding a periphery of the first insulating part 611A at a position spaced apart from the first insulating part 611A by a predetermined distance.

In addition, the insulating layer 610A may include the first insulating part 611A and the second insulating part 612A, and an open region 613A may be formed between the first insulating part 611A and the second insulating part 612A. Preferably, the first insulating part 611A and the second insulating part 612A may be spaced apart from each other with the open region 613A therebetween.

In addition, one end of the extension insulating part 614 may be connected to the first insulating part 611A, and the other end thereof may be connected to the second insulating part 612A. To this end, the extension insulating part 614 may be composed in plural. Preferably, the extension insulating part 614 may include first to fourth extension insulating parts 614.

The first insulating part 611A may include a plurality of outer portions. Preferably, the first insulating part 611A may include a left outer portion, a right outer portion, an upper outer portion, and a lower outer portion.

The second insulating part 612A may include a plurality of inner portions. Preferably, the second insulating part 612A may include a left inner portion, a right inner portion, an upper inner portion, and a lower inner portion.

In this case, the left outer portion of the first insulating part 611A and the left inner portion of the second insulating part 612A may be disposed facing each other. The right outer portion of the first insulating part 611A and the right inner portion of the second insulating part 612A may be disposed facing each other. The upper outer portion of the first insulating part 611A and the upper inner portion of the second insulating part 612A may be disposed facing each other. The lower outer portion of the first insulating part 611A and the lower inner portion of the second insulating part 612A may be disposed facing each other.

Here, the extension insulating part 614 does not connect an outer side of the first insulating part and an inner side of the second insulating part that face each other, but may connect the outer side of the first insulating part and the inner side of the second insulating part that do not face each other (or do not face or are misaligned or are not aligned) to each other.

For example, one end of the extension insulating part 614 is connected to the left outer portion of the first insulating part, and the other end thereof is not connected to the left inner portion of the second insulating part facing the left outer portion of the first insulating part, but may be connected to the upper inner portion of the second insulating part. That is, the extension insulating part 614 does not connect the outer portion of the first insulating part and the inner portion of the second insulating part disposed in parallel directions to each other, but may connect the outer portion of the first insulating part and the inner portion of the second insulating part disposed in directions crossing each other.

That is, when one end of the extension insulating part 614 is connected to the left outer portion of the first insulating part, the other end thereof may be connected to the upper inner portion of the second insulating part disposed in a direction crossing the left outer portion of the first insulating part.

Therefore, the extension insulating part 614 may be disposed in a form of rotating along a corner region on the open region 613A of the insulating layer 610A.

In addition, the extension insulating part 614 may be disposed on a plurality of side regions.

For example, when the extension insulating part 614 connects between the outer portion of the first insulating part and the inner portion of the second insulating part facing each other, the extension insulating part 614 may be disposed only in the one side region facing each other.

Alternatively, in the embodiment, since the extension insulating part 614 connects the outer portion of the first insulating part and the inner portion of the second insulating part that do not face each other, the extension insulating part 614 may be disposed on a side region connected to the first insulating part to which one end thereof is connected and on a side region connected to the second insulating part to which the other end thereof is connected, respectively. That is, the extension insulating part 614 has a plurality of bent structures, and may be disposed along one corner region on the open region 613A.

In conclusion, the extension insulating part 614 may have the same shape as the extension pattern part 649 constituting the conductive pattern part 640.

In other words, each of the first insulating part 611A, the second insulating part 612A, and the extension insulating part 614 may be formed in a separate configuration. That is, the first insulating part 611A and the second insulating part 614 are prepared, and the insulating layer 610A according to the embodiment may be configured by additionally forming a configuration corresponding to the extension insulating part 614 between the first insulating part 611A and the second insulating part 612A.

The insulating layer 610A may have a thickness of 20 µm to 100 µm. For example, the insulating layer 610A may have a thickness of 25 µm to 50 µm. For example, the insulating layer 610A may have a thickness of 30 µm to 40 µm. When the thickness of the insulating layer 610A exceeds 100 µm, the overall thickness of the image sensor substrate 600 may increase. When the thickness of the insulating layer 610A is less than 20 µm, it may be difficult to dispose the image sensor 700. When the thickness of the insulating layer 610A is less than 20 µm, it may be weak against heat/pressure, or the like in a process of mounting the image sensor, and thus it may be difficult to mount the image sensor 700 stably.

Meanwhile, a length of the extension insulating part 614 is set to be at least 1.5 times or more the linear distance between the first insulating part 611A and the second insulating part 612A. In addition, the length of the extension insulating part 614 is set to be 20 times or less the linear distance between the first insulating part 611A and the second insulating part 614. Preferably, the length of the extension insulating part 614 is set to be four times or less the linear distance between the first insulating part 611A and the second insulating part 612A.

Here, the linear distance may refer to a distance between the outer surface and the inner surface facing each other on the first insulating part 611A and the second insulating part 612A. Preferably, the linear distance may be a distance between the left outer surface of the first insulating part 611A and the left inner surface of the second insulating part 612A. In addition, the linear distance may be a distance between the right outer surface of the first insulating part 611A and the right inner surface of the second insulating part 612A. In addition, the linear distance may be a distance between the upper outer surface of the first insulating part 611A and the upper inner surface of the second insulating part 612A. In addition, the linear distance may be a distance between the lower outer surface of the first insulating part 611A and the lower inner surface of the second insulating part 612A.

Meanwhile, the linear distance between the first insulating part 611A and the second insulating part 612A may be 1.5 mm. In this case, when the length of the extension insulating part 614 is smaller than 1.5 times the linear distance between the first insulating part 614 and the second insulating part 612A, mobility of the image sensor substrate 600 may be reduced due to the decrease in the elastic force of the extension insulating part 614. In addition, when the length of the extension insulating part 614 is greater than 20 times the linear distance between the first insulating part 614 and the second insulating part 612A, the image sensor 700 disposed on the insulating layer 610A may not be stably supported, and accordingly, a problem in movement accuracy may occur. Accordingly, in the embodiment, in order to improve the mobility, the length of the extension insulating part 614 is set to be four times or less the linear distance between the first insulating part 611A and the second insulating part 612A.

Accordingly, the extension insulating part 614 may be formed to have a shape of a plurality of bent springs in the open region 613A.

Meanwhile, at least one slit (not shown) may be formed on the first insulating part 611A of the insulating layer 610A. The slit may be formed for maintaining flatness of the insulating layer 610A. That is, the conductive pattern part 640 and the image sensor 700 are disposed on the insulating layer 610A. In addition, the first driver is disposed below the insulating layer 610A. In this case, flatness of the first driver or the image sensor 700 directly affects the reliability of the camera module, and the image quality may be deteriorated as the flatness is worsen. Therefore, in the embodiment, not only a weight of the insulating layer 610A may be reduced but also the flatness may be maintained by forming at least one slit on the insulating layer 610A, thereby improving overall reliability of the camera module.

FIG. 10 is a plan view of the image sensor substrate of FIG. 9.

Referring to FIG. 9, the conductive pattern part 640 is disposed on the insulating layer 610A. In this case, open regions are formed in the insulating layer 610A, respectively.

In addition, an elastic member having elastic force may be disposed in the open region of the insulating layer 610A. Herein, the elastic member may refer to a part of the insulating layer 610A. That is, the elastic member may be formed as part of the insulating layer 610A. That is, the extension insulating part 614 having a bent shape bent a plurality of times is disposed in the open region of the insulating layer 610A. The extension insulating part 614 may have a spring shape.

Meanwhile, a line width of the extension insulating part 614 may be larger than that of the extension pattern part 649. Accordingly, when the image sensor substrate is viewed from above, at least a portion of the extension insulating part 614 located under the extension pattern part 649 may be exposed.

In this case, the image sensor substrate 600 may move not only in the X-axis direction and the Y-axis direction, but also in the Z-axis direction. In this case, there is a difference between the elastic modulus of the extension insulating part 614 and the elastic modulus of the extension pattern part 649. Accordingly, when the image sensor substrate 600 moves in the Z-axis direction, a movement distance of the extension insulating part 614 may appear different. In addition, this causes a situation in which the extension pattern part 649 is in contact with a component of another metal material, thereby causing an electrical reliability problem (for example, a short). Therefore, in the embodiment, as described above, the line width of the extension insulating part 614 may be larger than that of the extension pattern part 649 to solve the electrical reliability problem.

FIG. 11 is a view illustrating a camera device according to a third embodiment.

Referring to FIG. 11, the camera device according to the embodiment includes a lens barrel 100, a lens assembly 200, a housing 300, an infrared cut-off filter 400, drivers 510, 520, and 530, an image sensor substrate 600, an image sensor 700, and a flexible circuit board 800.

In this case, the camera device according to the second embodiment differs only in a structure of the image sensor substrate 600, and the other structures are the same in comparison with the camera device in FIG. 2, and thus, only the image sensor substrate 600 in the second embodiment will be described below.

The image sensor substrate 600 may include an insulating layer 610A, a first bonding sheet 620, a second bonding sheet 630, a conductive pattern part 640, and a support layer 650.

In this case, in the image sensor substrate 600, a configuration other than the second bonding sheet 630 is substantially the same as the structure illustrated in FIG. 9.

Therefore, the second bonding sheet 630 having a structure different from that of FIG. 9 will be described below.

The image sensor substrate 600 may further include the second bonding sheet 630. That is, the second bonding sheet 630 may be selectively disposed between the insulating layer 610A and the conductive pattern part 640.

That is, a problem may occur in adhesion between the insulating layer 610A and the conductive pattern part 640 during movement of the image sensor 700, and thus, the conductive pattern part 640 may be detached from the insulating layer 610A. Accordingly, the second bonding sheet 630 may be further disposed between the insulating layer 610A and the conductive pattern part 640.

Meanwhile, the second bonding sheet 630 may be disposed on the insulating layer 610 illustrated in FIG. 2, and alternatively, may be disposed on the insulating layer 610A illustrated in FIG. 9. FIG. 11 shows a shape of the second bonding sheet 630 disposed on the insulating layer 610A of FIG. 9. However, according to the embodiment, the second bonding sheet 630 may also be disposed on the insulating layer 610 of FIG. 2. In this case, the second bonding sheet 630 may include an open region similarly to the insulating layer 610, and may include a first bonding part on a first insulating part and a second bonding part on a second insulating part.

FIG. 12 is a view showing the second bonding sheet illustrated in FIG. 11.

Referring to FIG. 12, the second bonding sheet 630 is disposed on the insulating layer 610A. In this case, the second bonding sheet 630 has a planar shape corresponding to a planar shape of the insulating layer 610A.

That is, the second bonding sheet 630 may include a first bonding part 631 disposed on the first insulating part 611 of the insulating layer and a second bonding part 632 disposed on the second insulating part 612 of the insulating layer 610A. In addition, the second bonding sheet 630 may include an open region 633 between the first bonding part 631 and the second bonding part 632.

The second bonding part 632 is disposed surrounding a periphery of the first bonding part 631 at a position spaced apart from the first bonding part 631 by a predetermined distance. In this case, the second bonding part 632 is not in direct contact with the first bonding part 631. Therefore, the first bonding part 631 and the second insulating part 632 may be separated from each other by the open region 633.

In addition, an extension bonding part 634 connecting between the first bonding part 631 and the second bonding part 632 is disposed on the open region 633. The extension bonding part 634 has a shape corresponding to an extension insulating part 614. The extension bonding part 634 may be disposed on a region that vertically overlapped with the extension insulating part 614. In this case, the extension bonding part 634 may have a plane area corresponding to the extension insulating part 614. Preferably, the plane area of the extension bonding part 634 may be 0.9 to 1.1 times the plane area of the extension insulating part 614. The extension bonding part 634 of the second bonding sheet 630 may be formed through the same process as the extension insulating part 614 of the insulating layer 610A. Accordingly, the extension bonding part 634 may have the same planar area while having the same shape as the extension insulating part 614.

The second bonding sheet 630 may be formed of a double-sided adhesive film. The second bonding sheet 630 may be composed of an epoxy or, acrylic adhesive or a thermosetting adhesive film.

The second bonding sheet 630 may have a thickness of 25 μm.

FIG. 13 is a view illustrating a camera device according to a fourth embodiment.

Referring to FIG. 13, the camera device according to the embodiment includes a lens barrel 100, a lens assembly 200, a housing 300, an infrared cut-off filter 400, drivers 510, 520, and 530, an image sensor substrate 600, an image sensor 700, and a flexible circuit board 800.

In this case, the camera device according to the second embodiment differs only in a structure of the image sensor substrate 600, and the other structures are the same in comparison with the camera device in FIG. 2, and thus, only the image sensor substrate 600 in the second embodiment will be described below.

The image sensor substrate 600 may include an insulating layer 610A, a first bonding sheet 620, a conductive pattern part 640, and a support layer 650.

In this case, the image sensor substrate 600 may further include a spring plate 660 between the insulating layer 610 and the support layer 650. Here, since the remaining configuration except for the spring plate 660 has been described in the previous embodiment, a detailed description thereof will be omitted.

The spring plate 660 may move the image sensor 700 disposed on the image sensor substrate 600 in the X, Y, and Z-axis directions while supporting the insulating layer 610 and the conductive pattern part 640 constituting the image sensor substrate 600. To this end, the spring plate 660 may include at least one elastic member. Preferably, the spring plate 660 may include a plurality of elastic members. For example, the spring plate 660 may include four elastic members.

The spring plate 660 may be formed of a metal material such as stainless steel (STS) or invar, but the embodiment is not limited thereto. For example, the spring plate 660 may be formed of another metal material of a spring material having elastic force in addition to the material. That is, the spring plate 660 may have a predetermined elastic force, and accordingly, the spring plate 660 may move the image sensor substrate 600 in the X-axis, Y-axis, and Z-axis directions while elastically supporting the image sensor substrate 600.

The insulating layer 610 is disposed on the spring plate 660. In this case, the first bonding sheet 620 may be disposed between the spring plate 660 and the insulating layer 610. The first bonding sheet 620 may be disposed between the spring plate 660 and the insulating layer 610 to provide an adhesive force. That is, the first bonding sheet 620 may fix the insulating layer 610 on the spring plate 660. To this end, the first bonding sheet 620 may be formed of a double-sided adhesive film. The first bonding sheet 620 may be composed of an epoxy or acrylic adhesive.

FIG. 14 is a view showing the spring plate illustrated in FIG. 13.

Referring to FIG. 14, the spring plate 660 may elastically support the insulating layer 610 and the conductive pattern part 640 constituting the image sensor substrate 600.

The spring plate 660 may move the image sensor 700 disposed on the image sensor substrate 600 in the X, Y, and Z-axis directions.

To this end, the spring plate 660 may be formed of an elastic material. In detail, the spring plate 660 may include a plurality of elastic members having elastic force. For example, the spring plate 660 may include four elastic members 664, 665, 666, and 667.

The spring plate 660 may be formed of a metal material such as stainless steel (STS) or invar, but the embodiment is not limited thereto. For example, the spring plate 660 may be formed of another metal material of a spring material having elastic force in addition to the material. That is, the spring plate 660 may have a predetermined elastic force, and accordingly, the spring plate 660 may move the image sensor substrate 600 in the X-axis, Y-axis, and Z-axis directions while elastically supporting the image sensor substrate 600.

The spring plate 660 may include a first plate part 661, a second plate part 662, and elastic members 664, 665, 666, and 667.

Specifically, the first plate part 661 may be disposed at the center of the spring plate 660. The second plate part 662 may be disposed surrounding a periphery of the first plate part 661 at a position spaced apart from the first plate part 661 by a predetermined distance.

That is, the spring plate 660 may include the first plate part 661 and the second plate part 662, and an open region 663 may be formed between the first plate part 661 and the second plate part 662. Preferably, the first plate part 661 and the second plate part 662 may be separated from each other.

One end of the elastic members 664, 665, 666, and 667 may be connected to the first plate part 661, and the other end thereof may be connected to the second plate part 662. To this end, the elastic members 664, 665, 666, and 667 may include a first elastic member 664, a second elastic member 665, a third elastic member 666, and a fourth elastic member 667.

The first elastic member 664 may connect a first corner region of the first plate part 661 and a first corner region of the second plate part 662. One end of the first elastic member 664 may be connected to the first corner region of the first plate part 661, and the other end thereof may be connected to the first corner region of the second plate part 662 to elastically connect thereto. The first corner region may be a corner portion located at a left upper end of each plate.

The second elastic member 665 may connect a second corner region of the first plate part 661 and a second corner region of the second plate part 662. One end of the second elastic member 665 may be connected to the second corner region of the first plate part 661, and the other end thereof may be connected to the second corner region of the second plate part 662 to elastically connect thereto. The second corner region may be a corner portion located at a right upper end of each plate.

The third elastic member 666 may connect a third corner region of the first plate portion 661 and a third corner region of the second plate portion 662. One end of the third elastic member 666 may be connected to the third corner region of the first plate portion 661, and the other end thereof may be connected to the third corner region of the second plate portion 662 to elastically connect thereto. The third corner region may be a corner portion located at a left lower end of each plate.

The fourth elastic member 667 may connect a fourth corner region of the first plate part 661 and a fourth corner region of the second plate part 662. One end of the fourth elastic member 667 may be connected to the fourth corner region of the first plate part 661, and the other end thereof may be connected to the fourth corner region of the second plate part 662 to elastically connected thereto. The fourth corner region may be a corner portion located at a right lower end of each plate.

Meanwhile, it is illustrated in the drawing that the first plate part 661, the second plate part 662, and the elastic members 664, 665, 666, and 667 are separately configured, but the embodiment is not limited thereto. That is, the first plate part 661, the second plate part 662, and the elastic members 664, 665, 666, and 667 may be integrally formed with each other. That is, the spring plate 660 may form the open region 663 in a remaining portion except for a portion corresponding to the elastic members 664, 665, 666, and 667 on a plate of plate-shaped member.

Such a spring plate 660 may have a thickness of 10 μm to 100 μm. For example, the spring plate 660 may have a thickness of 20 μm to 70 μm. For example, the spring plate 660 may have a thickness of 40 μm to 50 μm. When the thickness of the spring plate 660 exceeds 100 μm, a thickness of the image sensor substrate 600 may increase. In addition, when the thickness of the spring plate 660 is smaller than 10 μm, a stress generated during movement of the image sensor substrate 600 may not be sufficiently maintained. Preferably, the spring plate 660 is set to have a thickness of 50 μm±10 μm to maintain a stress of 600 MPa or more.

In addition, the elastic members 664, 665, 666, and 667 have a length equal to or greater than a predetermined level. When the length of the elastic members 664, 665, 666, and 667 is too long, there is a problem that a volume of the spring plate 660 becomes large, and when the length of the elastic members 664, 665, 666, and 667 is too short, it may not be possible to stably and elastically support the image sensor substrate 600. Therefore, the elastic members 664, 665, 666, and 667 have a length of 50 μm to 100 μm. At this time, the length of the elastic members 664, 665, 666, and 667 is larger than the width of the open region 663. That is, the elastic members 664, 665, 666, and 667 may be formed to have a shape of a plurality of bent springs in the open region 663.

In addition, a plurality of slits 668 are formed in the first plate part 661. The plurality of slits 668 may be spaced apart from each other by a predetermined distance on the first plate part 661. The plurality of slits 668 may be formed for reducing a weight of the spring plate 660. In addition, the plurality of slits 668 may be formed for flatness of the spring plate 660. That is, the insulating layer 610, the conductive pattern part 640, and the image sensor 700 are disposed on the first plate part 661. The first driver is disposed below the first plate part 661. In this case, flatness of the first driver or the image sensor 700 directly affects the reliability of the camera module, and the image quality may be deteriorated as the flatness is worsen. Therefore, in the embodiment, not only the weight of the spring plate 660 may be reduced but also the flatness may be maintained by forming the plurality of slits 668 in the first plate part 661, thereby improving overall reliability of the camera module.

FIG. 15 shows an attaching structure of an image sensor on an image sensor substrate according to another embodiment.

Referring to FIG. 15, the image sensor may be attached on the image sensor substrate 600 by a flip chip bonding method.

That is, after the image sensor in the previous embodiment is attached on the insulating layer 610, the first conductive pattern portion 641, 642, 643, and 644 and the electrode 710 of the image sensor 700 were interconnected by a wire bonding method through a connecting member.

Alternatively, the image sensor may be mounted on a package substrate, and accordingly, may be mounted on the image sensor substrate 600 by the flip chip bonding method after the image sensor is attached on the insulating layer 610.

To this end, the package substrate 900 may include an insulating layer 910, a circuit pattern 920, a via 930, an image sensor 940, a connecting member 950, a protection member 960, and an adhesive member 970.

The image sensor 940 may be electrically connected to circuit patterns 920 disposed at upper and lower surfaces of the insulating layer 910 via the connecting member 950. In addition, the vias 930 may electrically connect the circuit patterns 920 disposed on the upper and lower surfaces of the insulating layer 910, respectively.

The protection member 960 may be disposed at the lower surface of the insulating layer 910 to expose at least a portion of the circuit pattern 920 while protecting the lower surface of the insulating layer 910. In addition, the adhesive member 970 may be disposed on the circuit pattern exposed through the protection member 960. The adhesive member 970 may be a solder ball. The adhesive member 970 may contain a material of heterogeneous component in solder.

The solder may be composed of at least one of SnCu, SnPb, and SnAgCu. The material of heterogeneous component may contain any one of Al, Sb, Bi, Cu, Ni, In, Pb, Ag, Sn, Zn, Ga, Cd, and Fe.

Meanwhile, in a state in which the package substrate 900 is manufactured as described above, the adhesive member 970 may be connected to the first conductive pattern parts 641, 642, 643, and 644.

Meanwhile, the characteristics of the drivers 510, 520, and 530 for moving the image sensor substrate in the embodiment are as shown in Table 1 below.

TABLE 1

|  | X-axis | Y-axis |
|---|---|---|
| Force (mN) | 4.5 | 8.5 |
| Displacement (mm) | 0.116 | 0.099 |
| Spring constant (mM/mm) | 38.79 | 85.85 |

The force (mN) refers to force of the drivers 510, 520, and 530, and force (mN) for driving the image sensor is set to 10 mN or less, and in this case, the image sensor substrate may move in X and Y-axes. That is, the image sensor substrate may be moved with a small force, and accordingly, a reaction speed (or response speed) to the movement of the image sensor substrate may be improved. The displacement (mm) refers to a value set when shifting the image sensor substrate by about 100 μm. That is, a force of 4.5 mM may be required on the X-axis and a force of 8.5 mM may be required on the Y-axis in order to set a displacement of about 100 μm. Meanwhile, the spring constant of a spring structure composed of the extension pattern part 649 in the embodiment indicates the force/displacement, and the spring constant of the X-axis is about 38.79 mN/mm, and the spring constant of the Y-axis is 85.85 mN/mm.

According to the embodiment, in order to realize OIS and AF functions of the camera module, instead of moving the conventional lens barrel, the image sensor is moved relative to the lens barrel in the X-axis, Y-axis, and Z-axis directions. Accordingly, the camera module according to the embodiment may remove a complicated spring structure for realizing the OIS and AF functions, thereby simplifying a structure. In addition, the structure that is more stable than the existing one may be formed by moving the image sensor according to the embodiment relative to the lens barrel.

In addition, according to the embodiment, the extension pattern part for electrically connecting the image sensor and the flexible circuit board has a spring structure and is disposed to be floated on the insulating layer. In this case, the extension pattern part serves as a circuit for transmitting a signal between the image sensor and the flexible circuit board and a spring for moving the image sensor in the X, Y, and Z axes. Accordingly, the camera module according to the embodiment may remove a structure such as a spring plate required to move the image sensor, and accordingly, manufacturing process may be facilitated by eliminating a process related to the spring plate.

In addition, according to the embodiment, in disposing the extension pattern part that functions as a spring, instead of connecting between the first lead pattern part and the second lead pattern part disposed in a region facing a region disposed in the first lead pattern part, the first lead pattern part and the second lead pattern part disposed in a region intersecting with the region in which the first lead pattern part is disposed are connected. Accordingly, the extension pattern part in the embodiment has a form disposed while rotating in a tilt direction of the image sensor. Accordingly, in the embodiment, a tilt operation of the image sensor may be stably performed using the extension pattern part.

In addition, in the embodiment, the extension pattern portion is disposed on the insulation layer, and the insulation layer may include an extension insulating part having a shape corresponding to the extension pattern part in a region vertically overlapped with the extension pattern part. Accordingly, the camera module may move the image sensor relative to the lens barrel while supporting the image sensor more stably and elastically.

In addition, a length of the extension pattern part in the embodiment has at least 1.5 times to 20 times a linear distance between the first lead pattern part and the second lead pattern part facing each other. Accordingly, it is possible to minimize noise generation while improving the mobility of the image sensor substrate.

In addition, a width of the extension insulation part in the embodiment is set to be larger than that of the extension pattern part, so that the extension pattern part may be stably supported by the extension insulation part, thereby improving operation reliability.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

Embodiments are mostly described above, but they are only examples and do not limit the embodiments. A person skilled in the art to which the embodiments pertain may appreciate that several variations and applications not presented above may be made without departing from the essential characteristic of the embodiments. For example, each component particularly represented in the embodiments may be varied. In addition, it should be construed that differences related to such a variation and such an application are included in the scope of the embodiment defined in the following claims.

The invention claimed is:

1. An image sensor substrate comprising:
    a spring plate;
    an insulating layer disposed on the spring plate; and
    a conductive pattern part disposed on the insulating layer,
    wherein the insulating layer includes:
        a first insulating part;
        a second insulating part disposed surrounding a periphery of the first insulating part and spaced apart from the first insulating part with a first open region interposed therebetween; and
        an extension insulating part disposed in the first open region and connecting between the first insulating part and the second insulating part,
    wherein the conductive pattern part includes:
        a first conductive pattern part disposed on the first insulating part;
        a second conductive pattern part disposed on the second insulating part; and
        an extension pattern part disposed on the extension insulating part and interconnecting the first and second conductive pattern parts,
    wherein the spring plate includes an elastic member disposed under the extension insulating part, and
    wherein the extension insulating part includes:
        an overlapping region overlapping with the elastic member in a thickness direction of the elastic member; and
        a non-overlapping region that does not overlap with the elastic member in the thickness direction.

2. The image sensor substrate of claim 1, wherein the spring plate further includes:
    a first plate part disposed under the first insulating part; and
    a second plate part disposed under the second insulating part and spaced apart from the first plate part with a second open region interposed therebetween, and
    wherein the elastic member is disposed in the second open region and connecting the first plate part and the second plate part.

3. The image sensor substrate of claim 2, wherein the second open region is overlapped with the first open region in the thickness direction.

4. The image sensor substrate of claim 3, wherein the elastic member is disposed in corner regions of the second open region and overlapping the extension pattern part disposed at corner regions of the first open region in the thickness direction.

5. The image sensor substrate of claim 1, wherein the conductive pattern part includes a metal layer and a plating layer, the plating layer being disposed on the metal layer.

6. The image sensor substrate of claim 5, wherein the plating layer contain at least one of gold (Au), silver (Ag), or palladium (Pd).

7. The image sensor substrate of claim 5, wherein the plating layer includes at least one region having different thicknesses on a metal layer of at least one of the first conductive pattern part, the second conductive pattern part, and the extension pattern part.

8. The image sensor substrate of claim 5, wherein a thickness of the plating layer is 0.3 µm to 1.0 µm.

9. The image sensor substrate of claim 5, wherein a thickness of the plating layer is 0.3 µm to 0.7 µm.

10. The image sensor substrate of claim 5, wherein a thickness of the plating layer is 0.3 µm to 0.5 µm.

11. The image sensor substrate of claim 1, wherein the first conductive pattern part includes a metal layer and a plating layer on the metal layer.

12. The image sensor substrate of claim 11, wherein the plating layer contains at least one of gold (Au), silver (Ag), or palladium (Pd).

13. The image sensor substrate of claim 1, wherein a width of the extension insulating part is larger than that of the extension pattern part.

14. The image sensor substrate of claim 1, wherein the extension pattern part includes a metal layer and a plating layer on the metal layer.

15. The image sensor substrate of claim 14, wherein the plating layer is disposed surrounding at least one side of the extension pattern part.

16. The image sensor substrate of claim 1, wherein the second conductive pattern part includes a metal layer and a plating layer on the metal layer.

17. The image sensor substrate of claim 16, wherein the plating layer contains at least one of gold (Au), silver (Ag), or palladium (Pd).

18. The image sensor substrate of claim 1, further comprising an image sensor, wherein the conductive pattern part is electrically connected to the image sensor.

* * * * *